(12) United States Patent
Cheng et al.

(10) Patent No.: US 11,460,498 B2
(45) Date of Patent: Oct. 4, 2022

(54) ADJUSTABLE PROBE DEVICE FOR IMPEDANCE TESTING FOR CIRCUIT BOARD

(71) Applicant: MPI CORPORATION, Chu-Pei (TW)

(72) Inventors: Yang-Hung Cheng, Chu-Pei (TW); Ya-Hung Lo, Chu-Pei (TW); Chien-Hsun Chen, Chu-Pei (TW); Chia-Nan Chou, Chu-Pei (TW); Chung-Yen Huang, Chu-Pei (TW); Shou-Jen Tsai, Chu-Pei (TW); Fuh-Chyun Tang, Chu-Pei (TW)

(73) Assignee: MPI CORPORATION, Chu-Pei (TW)

( * ) Notice: Subject to any disclaimer, the term of this patent is extended or adjusted under 35 U.S.C. 154(b) by 101 days.

(21) Appl. No.: 17/034,741

(22) Filed: Sep. 28, 2020

(65) Prior Publication Data

US 2021/0102992 A1 Apr. 8, 2021

Related U.S. Application Data

(60) Provisional application No. 62/934,687, filed on Nov. 13, 2019, provisional application No. 62/910,543, filed on Oct. 4, 2019.

(30) Foreign Application Priority Data

May 18, 2020 (TW) .................................. 109116424
Sep. 3, 2020 (TW) .................................. 109130249

(51) Int. Cl.
*G01R 31/28* (2006.01)
*G01R 1/073* (2006.01)

(52) U.S. Cl.
CPC ..... *G01R 31/2812* (2013.01); *G01R 1/07307* (2013.01)

(58) Field of Classification Search
CPC .......................... G01R 1/07307; G01R 31/2812
See application file for complete search history.

(56) References Cited

U.S. PATENT DOCUMENTS

| 9,857,392 B2 * | 1/2018 | McTigue | G01R 1/06788 |
| 2007/0159195 A1 * | 7/2007 | Yang | G01R 1/06788 324/754.14 |
| 2016/0178664 A1 | 6/2016 | McTigue et al. | |

FOREIGN PATENT DOCUMENTS

TW            200706883 A      2/2007

* cited by examiner

*Primary Examiner* — Paresh Patel
(74) *Attorney, Agent, or Firm* — Birch, Stewart, Kolasch & Birch, LLP

(57) ABSTRACT

An adjustable probe device includes fixed and movable probes, at least one of which is a signal probe having a coaxial structure. The movable probe is linearly slidable with a ground unit thereof abutted against a ground unit of the fixed probe. Another adjustable probe device includes a first movable probe for being grounded, and fixed and second movable probes both having a coaxial structure. Any of the two movable probes is selectable to be a functioning probe in a way that the contact ends of the functioning and fixed probes are located on a same plane for contacting two pads of a DUT at the same time, and the functioning probe is linearly slidable with a ground unit thereof abutted against a ground unit of the fixed probe. As a result, the probe interval is adjustable, lowering the cost of the impedance testing apparatus for circuit boards.

18 Claims, 21 Drawing Sheets

ADJUSTABLE PROBE DEVICE FOR IMPEDANCE TESTING FOR CIRCUIT BOARD

BACKGROUND OF THE INVENTION

1. Field of the Invention

The present invention relates generally to impedance testing apparatuses for circuit boards and more particularly, to an adjustable probe device for impedance testing for a circuit board.

2. Description of the Related Art

The conventional impedance testing apparatus for a printed circuit board (hereinafter referred to as "PCB") primarily includes a testing machine and a probe device. The probe device primarily includes a plurality of probes for contacting electrically conductive contacts of the printed circuit board. For high frequency impedance testing, the probes are coaxial probes each including a core and a ground conductor surrounding around and insulated from the core. The probes are electrically connected with the testing machine through coaxial signal cables. The probes are paired in a way that for every two probes in a pair, the interval therebetween is fixed, the pinpoints thereof are located very close to each other and the ground conductors thereof are electrically conductive to each other.

However, the impedance testing for printed circuit boards requires various probe intervals and angles, so it needs a plurality of different probe devices to fulfill the various testing requirements. That means when the probe interval or angle required for the impedance testing for the printed circuit board is changed, the probe device has to be replaced. Such testing apparatus is high in cost and thereby needs improvement.

SUMMARY OF THE INVENTION

The present invention has been accomplished in view of the above-noted circumstances. It is an objective of the present invention to provide an adjustable probe device for impedance testing for a circuit board, the probe interval of which is adjustable, thereby lowering the cost of the impedance testing apparatus for circuit boards.

To attain the above objective, the present invention provides an adjustable probe device for impedance testing for a circuit board, which includes a fixed probe and a movable probe. Each of the fixed probe and the movable probe includes a ground unit for being electrically connected to ground potential. At least one of the fixed and movable probes further includes a core relatively fixed to and insulated from the ground unit for transmitting test signal. The movable probe is linearly slidable relative to the fixed probe along a first axis in a way that the ground unit of the movable probe is abutted against the ground unit of the fixed probe.

As a result, among the fixed probe and the movable probe, anyone including the ground unit and the core may serve as a signal probe for being electrically connected with a testing machine through a coaxial signal cable, and anyone including no such core may serve as a ground probe for ground connection. That means the fixed probe and the movable probe may be both signal probes, or one of them is a signal probe and the other is a ground probe. The ground units of the fixed probe and the movable probe are electrically conductive to each other by being abutted against each other, so that the fixed probe and the movable probe complete a circuit loop and have equal ground potential. The distance between the movable probe and the fixed probe is changeable by the linear sliding of the movable probe relative to the fixed probe along the first axis, so the interval between the pinpoints of the fixed probe and the movable probe is adjustable according to the interval between electrically conductive contacts of a device under test (hereinafter referred to as "DUT").

To attain the above objective, the present invention provides another adjustable probe device for impedance testing for a circuit board, which includes a fixed probe and two movable probes. The fixed probe includes a ground unit for being electrically connected to ground potential, and a core for transmitting test signal. The core of the fixed probe has a contact end. The ground unit and the core of the fixed probe are relatively fixed to each other and insulated from each other. Each of the two movable probes includes a ground unit for being electrically connected to ground potential. The two movable probes include a first movable probe and a second movable probe. The ground unit of the first movable probe has a contact end. The second movable probe includes a core for transmitting test signal. The core of the second movable probe has a contact end. The ground unit and the core of the second movable probe are relatively fixed to each other and insulated from each other. Anyone of the two movable probes is selectable to serve as a functioning probe of the adjustable probe device in a way that the contact end of the functioning probe and the contact end of the fixed probe are located on a same imaginary plane parallel to a first axis and a second axis perpendicular to the first axis, and the functioning probe is linearly slidable relative to the fixed probe along the first axis in a way that the ground unit of the functioning probe is abutted against the ground unit of the fixed probe.

In other words, the fixed probe and the second movable probe are both signal probes, and the first movable probe is a ground probe. According to the testing requirement, the user can choose anyone of the first and second movable probes to be used in association with the fixed probe. That means the user can choose a collocation of a signal probe with another signal probe or another collocation of a signal probe with a ground probe. The ground unit of the chosen movable probe, i.e. the functioning probe, and the ground unit of the fixed probe are electrically conductive to each other by being abutted against each other, and the distance between the functioning probe and the fixed probe is changeable by the linear sliding of the functioning probe relative to the fixed probe along the first axis, so the interval between the pinpoints of the fixed probe and the functioning probe is adjustable according to the interval between the electrically conductive contacts of the device under test.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
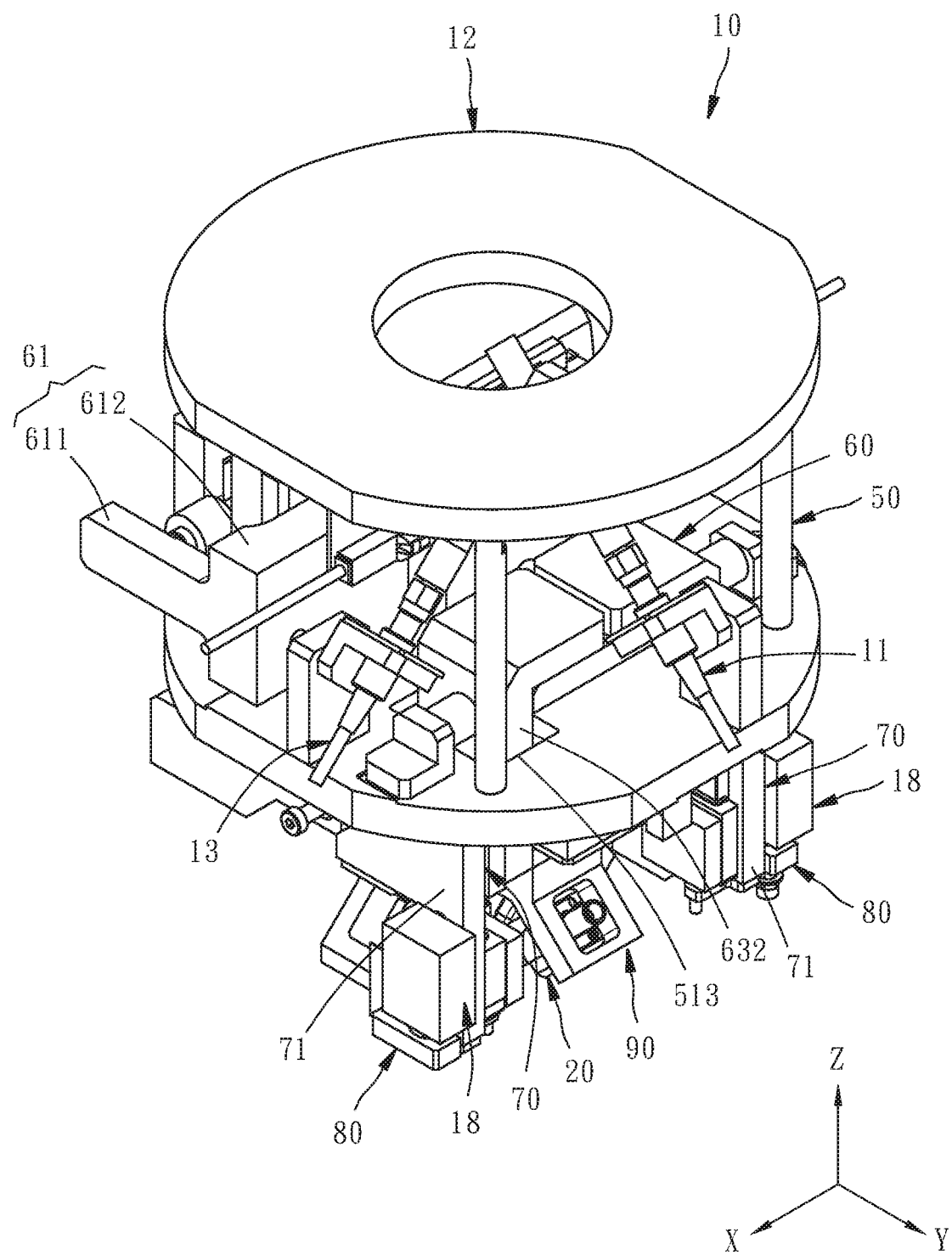
FIGS. 1 and 2 are assembled perspective views of an adjustable probe device for impedance testing for a circuit board according to a preferred embodiment of the present invention in different directions.

First of all, it is to be mentioned that same or similar reference numerals used in the following embodiments and the appendix drawings designate same or similar elements or the structural features thereof throughout the specification for the purpose of concise illustration of the present invention. Besides, in the following embodiments and claims, when it is mentioned that an element is disposed on another element, it means that the former element is directly is disposed on the latter element, or the former element is indirectly is disposed on the latter element through one or more other elements between aforesaid former and latter elements. When it is mentioned that an element is 'directly' disposed on another element, it means that no other element is disposed between aforesaid former and latter elements.

Figure 2:
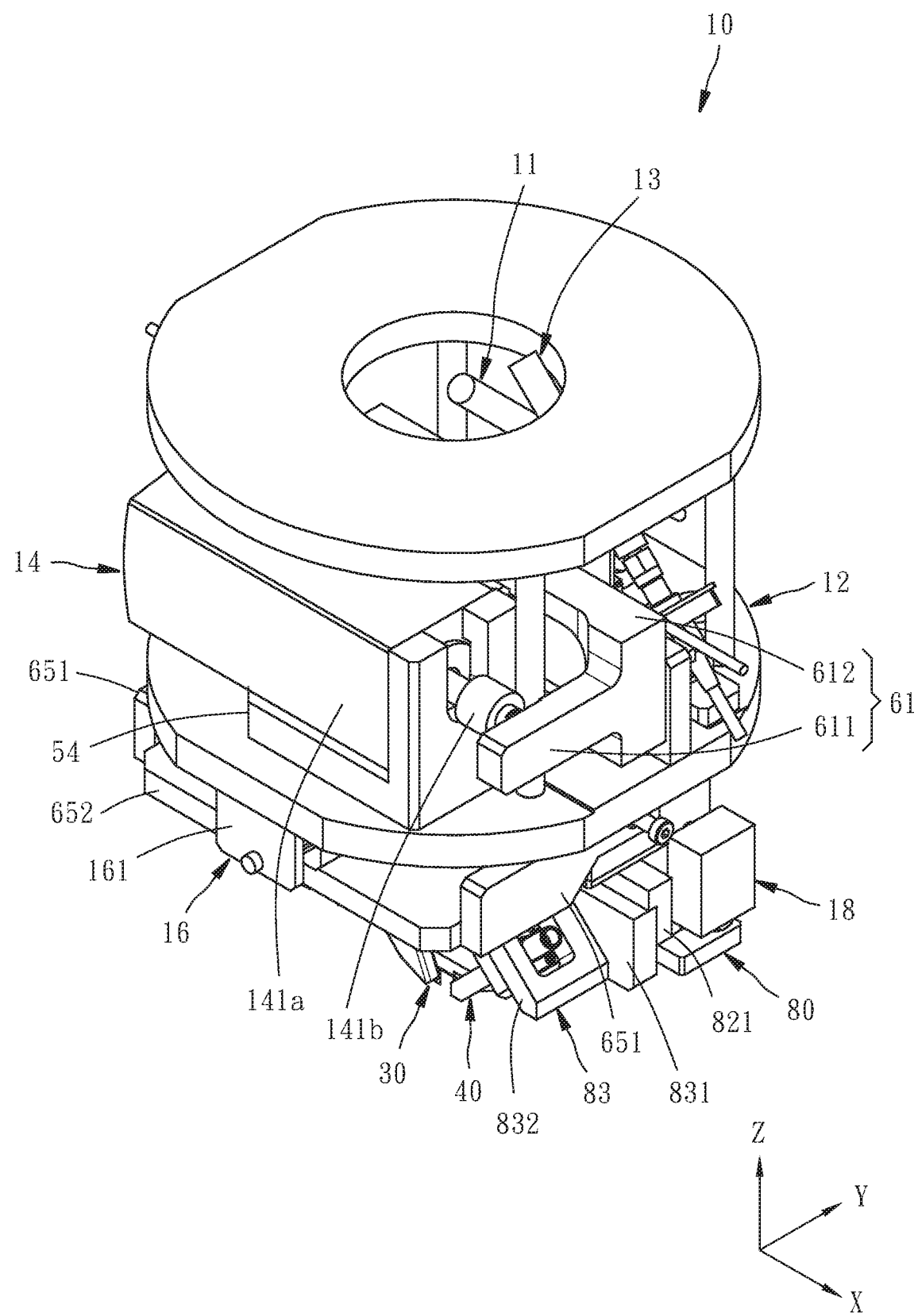

Referring to FIGS. 1 and 2, an adjustable probe device 10 for impedance testing for a circuit board according to a preferred embodiment of the present invention includes a drive mechanism 12, and a fixed probe 20, a first movable probe 30 and a second movable probe 40 disposed on the drive mechanism 12.

The drive mechanism 12 includes a first drive unit 14, a second drive unit 16, two third drive units 18, a fixed unit 50, a first movable unit 60, two second movable units 70, two third movable units 80, and a fixed probe seat unit 90.

Figure 3:
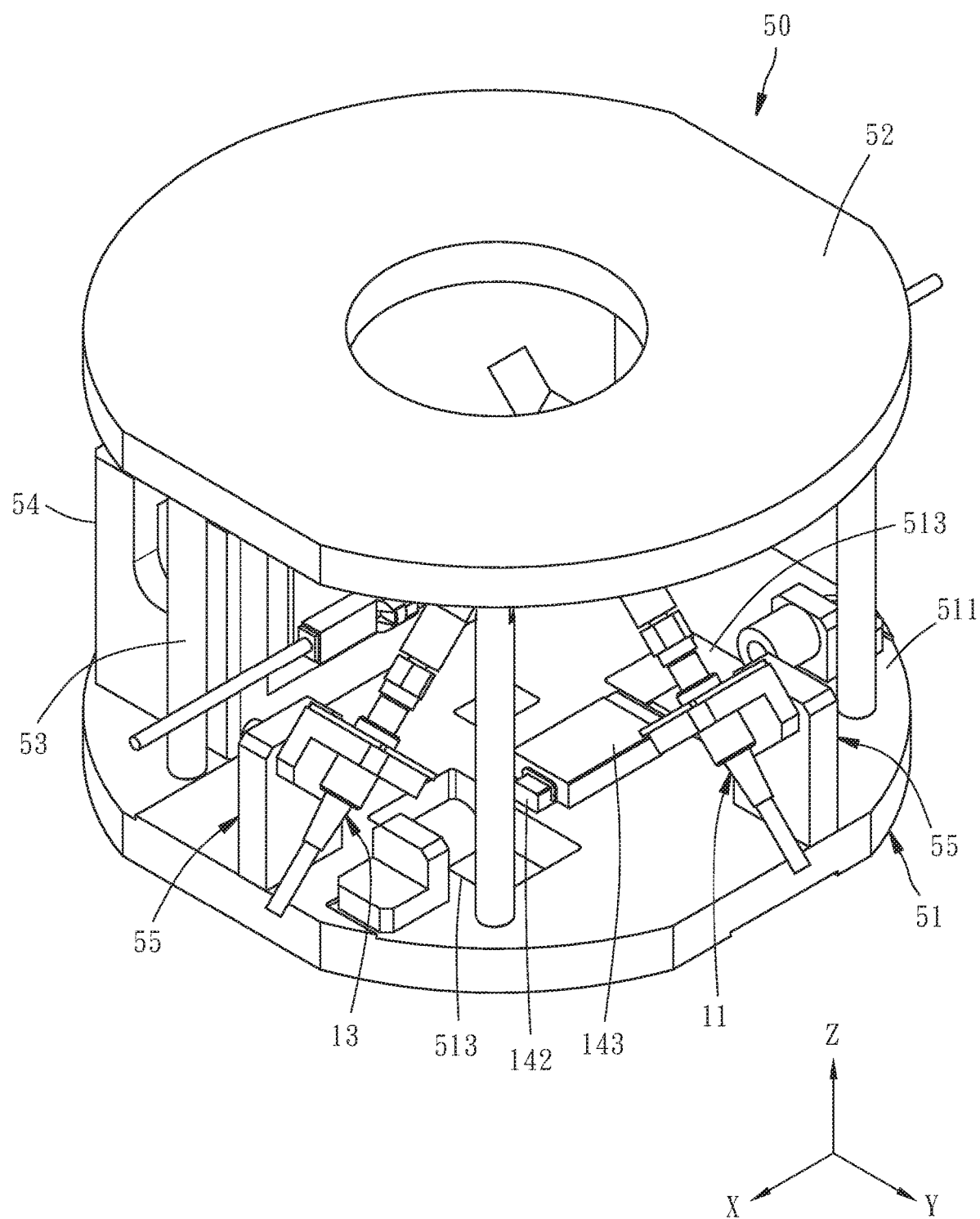
FIG. 3 is an assembled perspective view of a part of members of a drive mechanism of the adjustable probe device, primarily showing a fixed unit of the drive mechanism.

Referring to FIG. 3, the fixed unit 50 primarily includes a base 51, a top plate 52 arranged parallel to the base 51, four vertical columns 53 connecting the base 51 and the top plate 52, and a driver installation seat 54 and two signal cable fixation seats 55 fixed on a top surface 511 of the base 51. The base 51 has two rectangular through holes 513 penetrating through the top surface 511 and bottom surface 512 of the base 51. Two coaxial signal cables 11 and 13 are disposed on the signal cable fixation seats 55 respectively.

Figure 4:
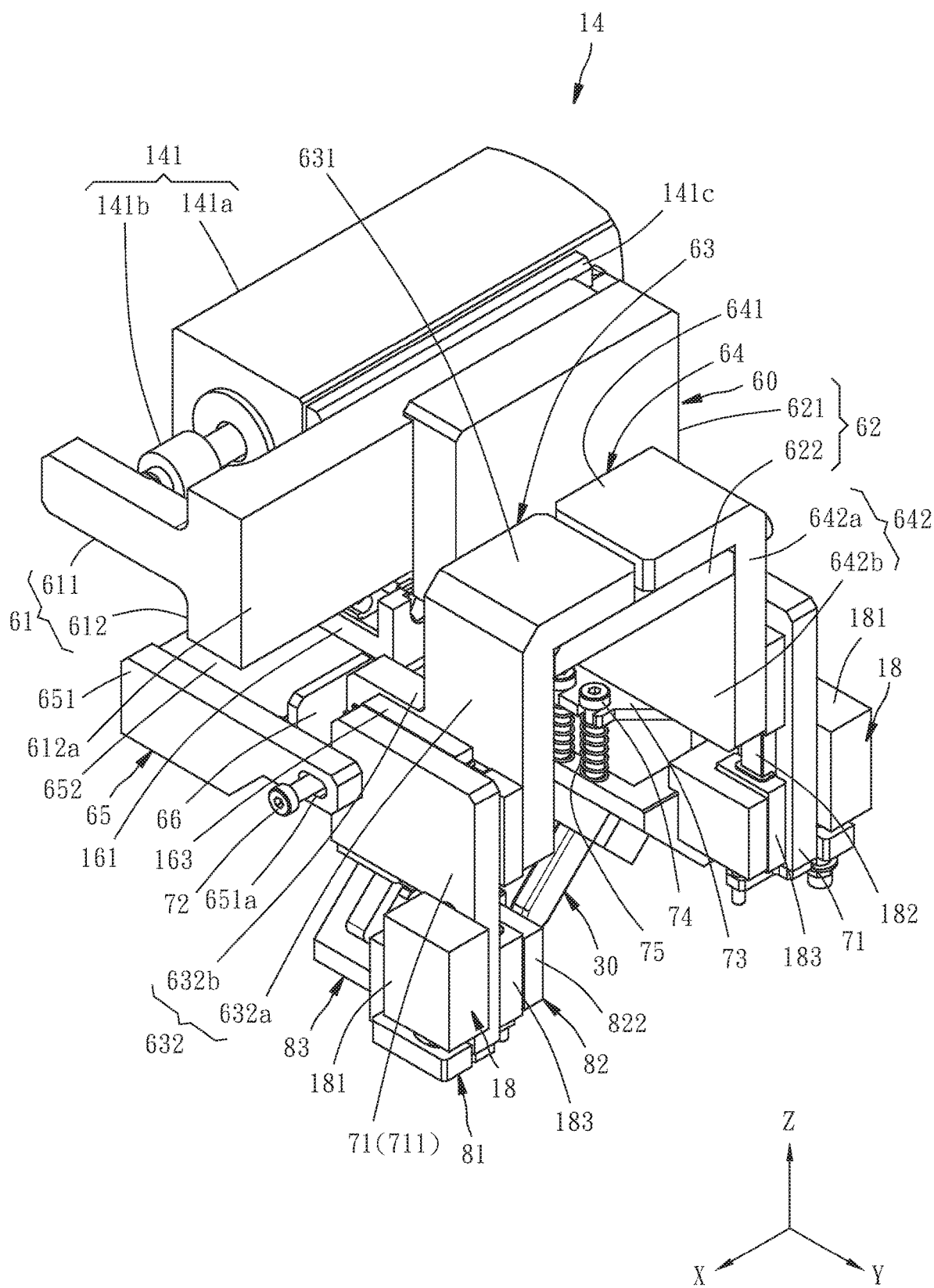
FIG. 4 is an assembled perspective view of two movable probes and another part of the members of the drive mechanism of the adjustable probe device.

Referring to FIGS. 3 and 4, the first drive unit 14 primarily includes a first driver 141 (e.g. motor) and a slide module. The slide module includes a slide rail 142 fixed on the top surface 511 of the base 51, and a slider 143 disposed on the slide rail 142 slidably along a first axis (X-axis). The first driver 141 includes a main body 141a fixed to the driver installation seat 54, and an output shaft 141b movable along the X-axis relative to the main body 141a. The main body 141a is provided on a surface thereof facing toward the positive direction of a second axis (Y-axis) with a slideway 141c.

Figure 6:
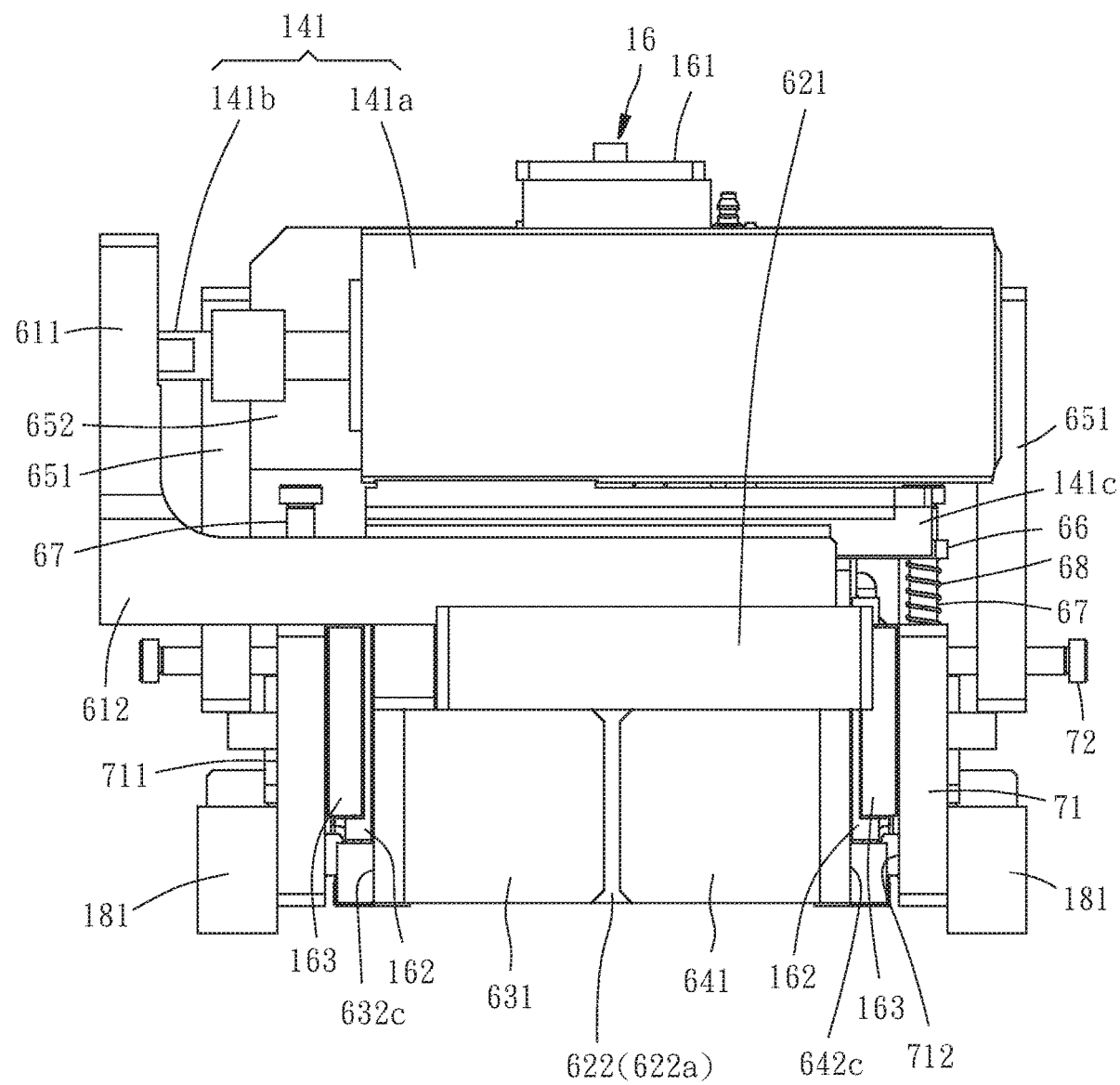
FIGS. 6-9 are top, bottom, lateral and front views of the assembly shown in FIG. 4 respectively.

The first movable unit 60 includes four connecting seats 61-64. The connecting seat 61 has two connecting portions 611 and 612 connected integrally to form an L-shape. The connecting portion 611 is fixed to the output shaft 141b of the first driver 141. The connecting portion 612 is disposed on the slideway 141c of the first driver 141 slidably along the first axis (X-axis). The connecting seat 62 has two connecting portions 621 and 622 connected integrally to form an L-shape. The connecting portion 621 is fixed on a surface 612a of the connecting portion 612 facing toward the positive direction of the Y-axis. The connecting portion 622 is fixed to the slider 143 of the first drive unit 14 as shown in FIG. 3. The two connecting seats 63 and 64 are the same in shape and arranged symmetrically to each other. Each of the two connecting seats 63 and 64 has a connecting portion 631 or 641 and an installation portion 632 or 642, which are connected integrally to form an L-shape. Each of the installation portions 632 and 642 has a relatively narrower section 632a or 642a, and a relatively wider section 632b or 642b. The connecting portions 631 and 641 of the two connecting seats 63 and 64 are fixed on a surface 622a of the connecting portion 622 facing toward the positive direction of a third axis (Z-axis), as shown in FIG. 6. The relatively narrower sections 632a and 642a of the installation portions 632 and 642 of the two connecting seats 63 and 64 are inserted through the through holes 513 of the base 51 respectively, as shown in FIG. 1. In this way, the first movable unit 60 can be driven by the first driver 141 and guided by the slide module of the first drive unit 14 to move along the first axis (X-axis). Therefore, in the scope of the two through holes 513 for the movement of the two installation portions 632 and 642, the two installation portions 632 and 642 are movable simultaneously along the first axis (X-axis). It should be noticed that the two connecting seats 63 and 64 may be connected integrally to become a same element.

Figure 8:
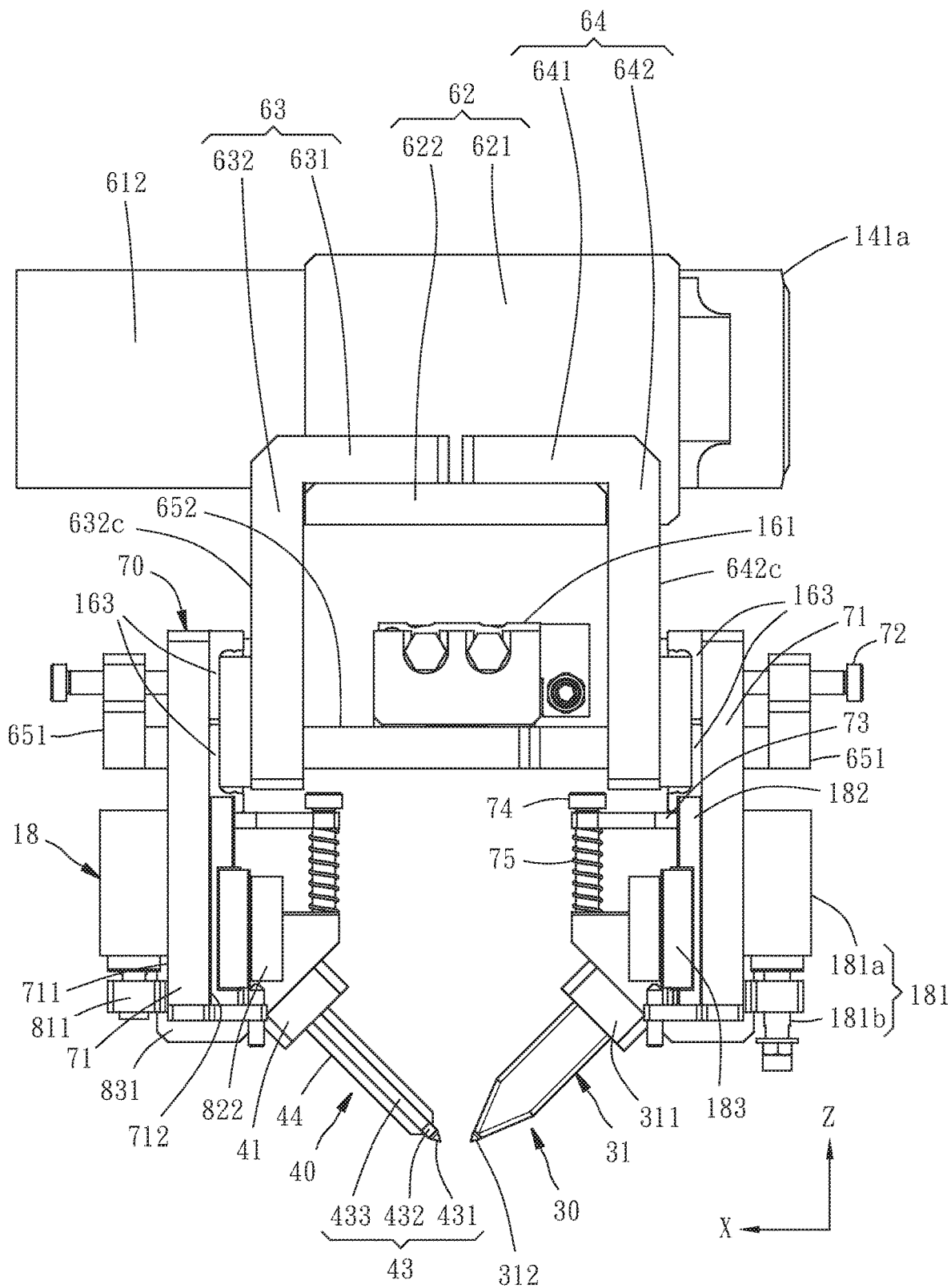

Referring to FIGS. 4, 6 and 8, the second drive unit 16 primarily includes a second driver 161 (e.g. pneumatic cylinder) and four slide modules. Each of the two installation portions 632 and 642 of the first movable unit 60 is provided with two of the slide modules disposed on the relatively wider section 632b or 642b in a way that one of the two slide modules is located above the other, as shown in FIG. 8. Each of the slide modules includes a slide rail 162 fixed on a surface 632c or 642c of the associated installation portion 632 or 642 parallel to the Y-Z plane, and a slider 163 disposed on the slide rail 162 slidably along the Y-axis.

Each of the second movable units 70 primarily includes an installation plate 71. The installation plate 71 is fixed to the sliders 163 located on the associated installation portion 632 or 642. The two second movable units 70 can be driven by the second driver 161 and guided by the slide modules of the second drive unit 16 to move along the second axis (Y-axis) relative to the installation portions 632 and 642.

Specifically speaking, the second driver 161 is fixed on the bottom surface 512 of the aforementioned base 51. Besides, as shown in FIG. 2, the second driver 161 is disposed on an installation seat 65 and capable of driving the installation seat 65 to move along the second axis (Y-axis). The installation seat 65 includes two lateral plates 651, and a connecting plate 652 connecting the two lateral plates 651. The second driver 161 is disposed on the connecting plate 652 of the installation seat 65. The two lateral plates 651 partially face the surfaces 711 of the installation plates 71 of the two second movable units 70 parallel to the Y-Z plane respectively. As shown in FIG. 4, each of the lateral plates 651 is provided at the portion thereof facing toward the installation plate 71 with an elongated hole 651a, and a bolt 72 is inserted through the elongated hole 651a and fixed to the associated installation plate 71. In this way, the second driver 161 can drive the installation seat 65 to move along the second axis (Y-axis) so as to drive the two second movable units 70 to move along the second axis (Y-axis). In other words, the two second movable units 70 move simultaneously along the Y-axis.

As shown in FIG. 8, the two third drive units 18 are disposed on the installation plates 71 of the two second movable units 70 respectively. Each of the third drive units 18 primarily includes a third driver 181 (e.g. pneumatic cylinder) and a slide module. Each of the slide modules includes a slide rail 182 fixed on another surface 712 of the associated installation plate 71 parallel to the Y-Z plane, and a slider 183 disposed on the slide rail 182 slidably along the Z-axis. Each of the third drivers 181 includes a main body 181a fixed on the surface 711 of the associated installation plate 71, and an output shaft 181b movable along the Z-axis relative to the main body 181a.

Figure 7:
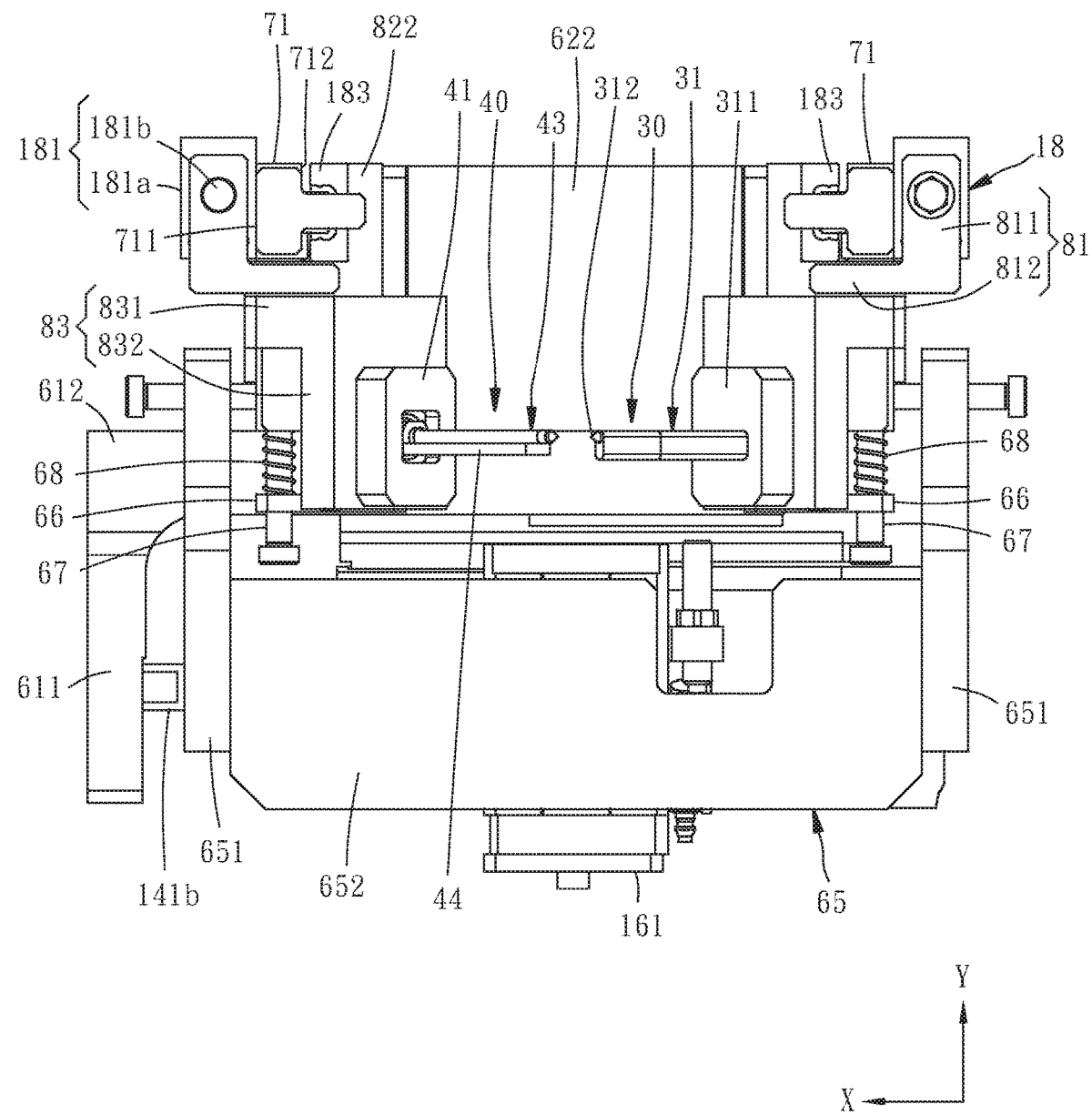
Figure 9:
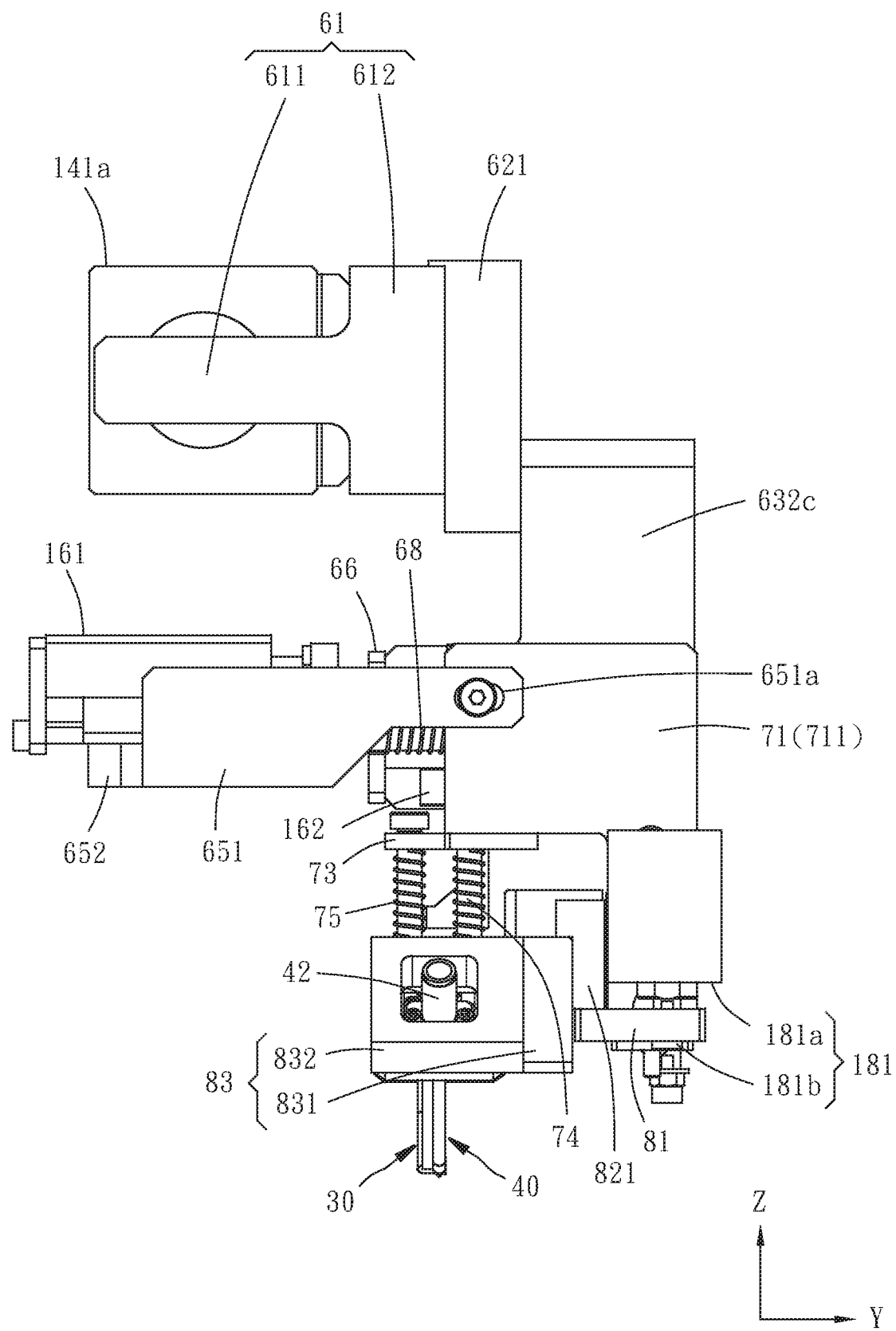

As shown in FIG. 1, the two third movable units 80 are disposed on the two second movable units 70 through the two third drive units 18 respectively. Each of the third movable units 80 includes two connecting seats 81 and 82 and a probe seat 83 as shown in FIG. 4. Each of the connecting seats 81 has two connecting portions 811 and 812 connected integrally to form an L-shape, as shown in FIG. 7. The connecting portion 811 is fixed to the output shaft 181b of the associated third driver 181. As shown in FIGS. 7-9, each of the connecting seats 82 has two connecting portions 821 and 822 connected integrally to form an L-shape. The connecting portion 821 is fixed to the connecting portion 812 of the associated connecting seat 81. The connecting portion 822 is fixed to the slider 183 of the associated third drive unit 18. Each of the probe seats 83 includes a connecting portion 831 and an installation portion 832, which are connected integrally. The connecting portion 831 is fixed to the connecting portion 821 of the associated connecting seat 82. In this way, the two third movable units 80 can be individually driven by the associated third driver 181 and guided by the slide module of the third drive unit 18 to move individually along the third axis (Z-axis) relative to the associated installation plate 71. In other words, the Z-axial displacements of the two third movable units 80 are independent from each other.

The first movable probe 30 and the second movable probe 40 are fixed to the installation portions 832 of the probe seats 83 of the two third movable units 80 respectively, which will be specified in the following content. That means the first movable probe 30 and the second movable probe 40 are disposed on the two installation portions 632 and 642 of the first movable unit 60 respectively through the third movable units 80, the slide modules of the third drive units 18, the second movable units 70 and the slide modules of the second drive unit 16. Therefore, the two movable probes 30 and 40 are moved by the first movable unit 60 at the same time to displace along the first axis (X-axis) simultaneously, which means the X-axial relative position between the two movable probes 30 and 40 is fixed. The two movable probes 30 and 40 can be also moved by the two second movable units 70 respectively to move along the Y-axis simultaneously, which means the Y-axial relative position between the two movable probes 30 and 40 is fixed. The two movable probes 30 and 40 can be also moved by the two third movable units 80 respectively to move along the Z-axis, which means the Z-axial displacements of the two movable probes 30 and 40 are independent from each other.

Figure 5:
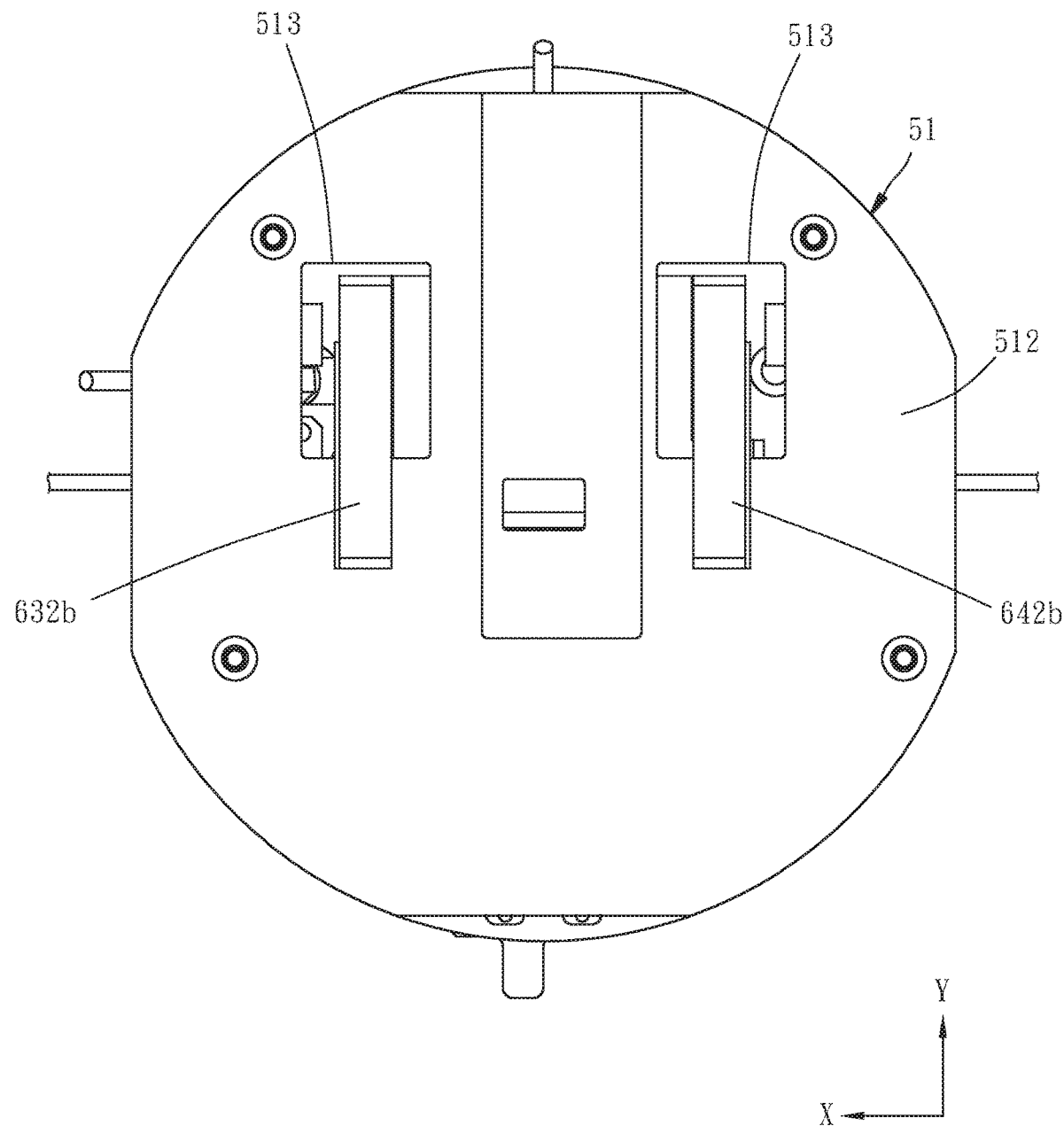
FIG. 5 is a bottom view of the members shown in FIG. 3 and a first movable unit.

By the above-described arrangement of the drive mechanism 12, the first movable unit 60 is mostly disposed on the top surface 511 of the base 51, but the installation portions 632 and 642 of the two connecting seats 63 and 64 extend to the bottom surface 512 of the base 51, and the relatively wider sections 632b and 642b of the installation portions 632 and 642 of the two connecting seats 63 and 64 are completely located on the bottom surface 512 of the base 51, as shown in FIG. 5. The second and third movable units 70 and 80 are disposed on the relatively wider sections 632b and 642b of the installation portions 632 and 642 of the two connecting seats 63 and 64, thereby also completely located on the bottom surface 512 of the base 51. Such arrangement can prevent the X-axial movement of the drive mechanism 12 from interference with the Y-axial and Z-axial movements of the drive mechanism 12.

Figure 10:
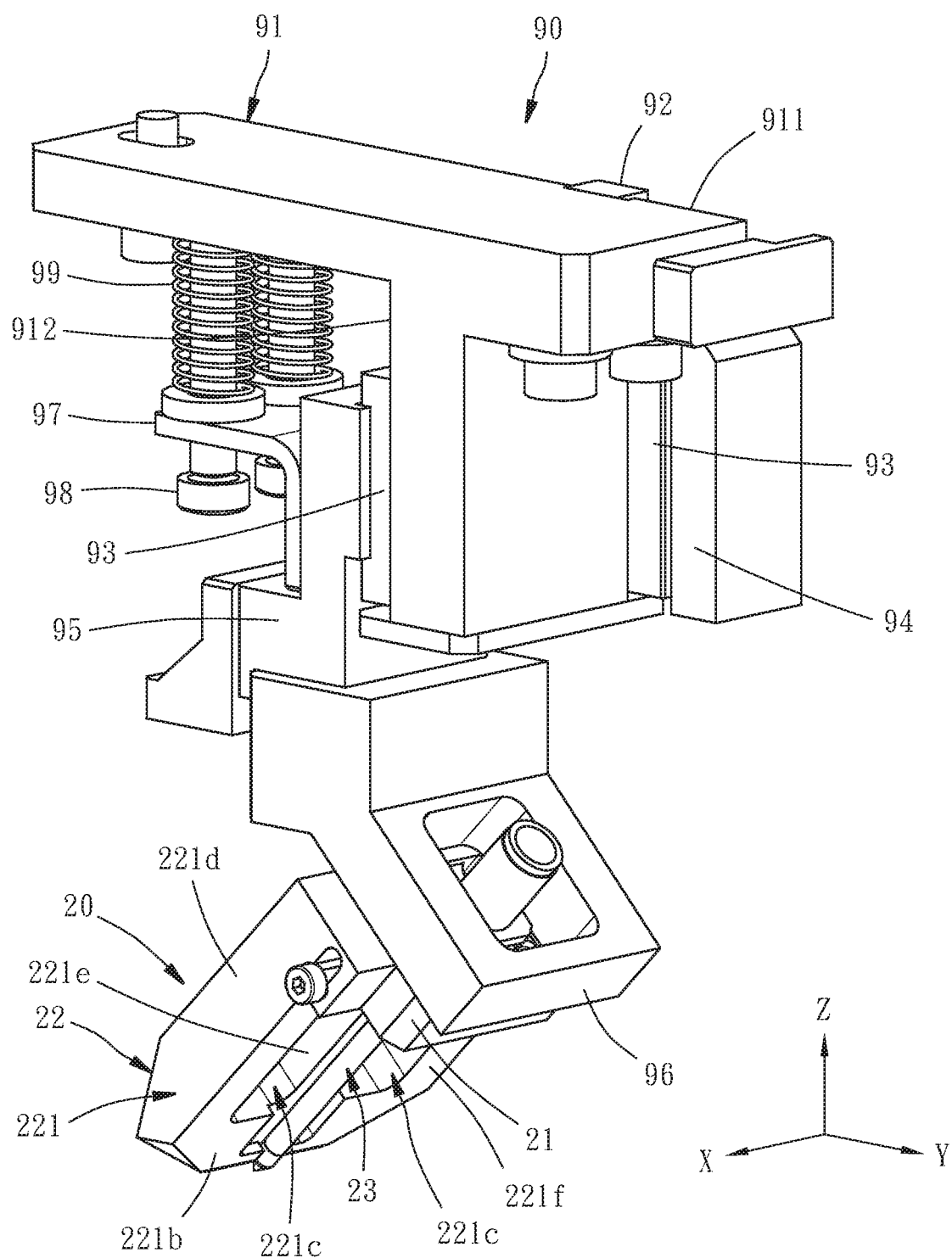
FIG. 10 is an assembled perspective view of a fixed probe seat unit of the drive mechanism and a fixed probe of the adjustable probe device.
Figure 11:
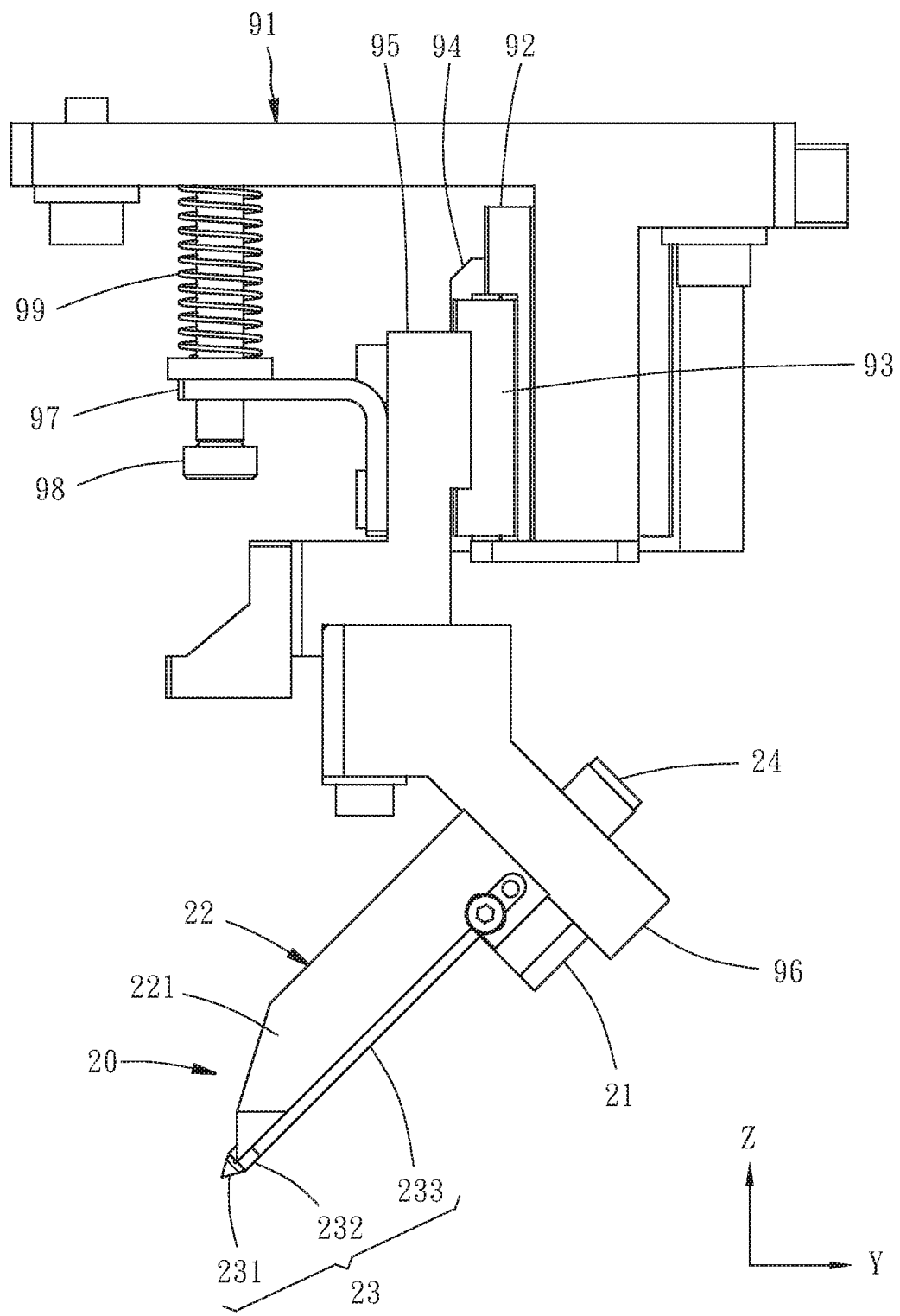
FIG. 11 is a front view of FIG. 10.

Referring to FIGS. 10 and 11, the fixed probe seat unit 90 primarily includes a fixation seat 91 fixed on the bottom surface 512 of the base 51 of the fixed unit 50, two slide rails 92 respectively fixed on a surface 911 of the fixation seat 91 parallel to the Y-Z plane and another surface 912 of the fixation seat 91 parallel to the X-Z plane, two sliders 93 respectively disposed on the two slide rails 92 slidably along the Z-axis, two connecting seats 94 and 95 fixed to the two sliders 93 respectively and fixed to each other, a probe seat 96 and an abutment member 97 both fixed to the connecting seat 95, two shafts 98 penetrating through the abutment member 97 and fixed to the fixation seat 91, and two elastic members 99 sleeved onto the two shafts 98 respectively and abutted between the abutment member 97 and the fixation seat 91.

Figure 12:
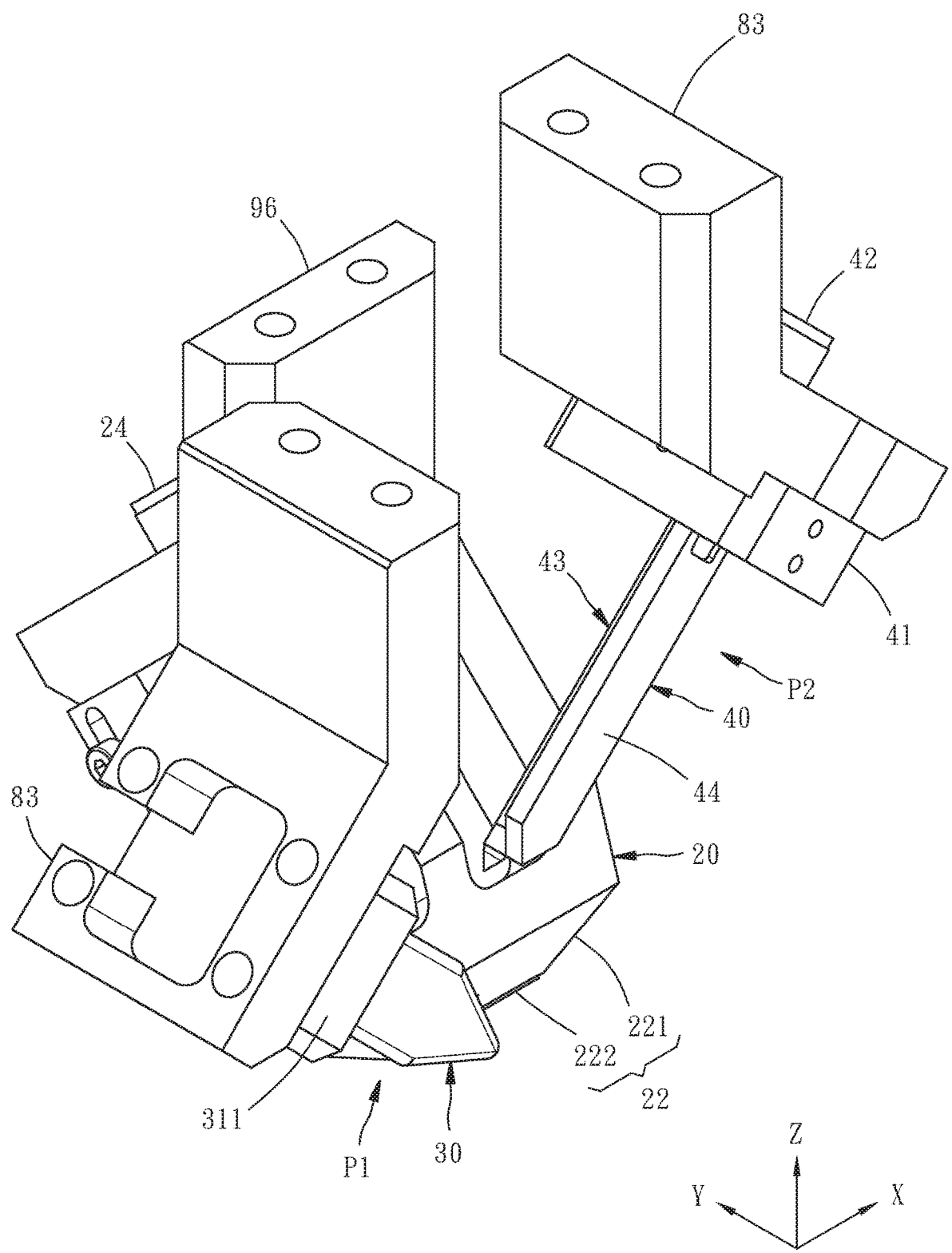
FIG. 12 is a schematic perspective view of three probe seats and the fixed and movable probes of the adjustable probe device, showing a usage condition of the adjustable probe device.
Figure 13:
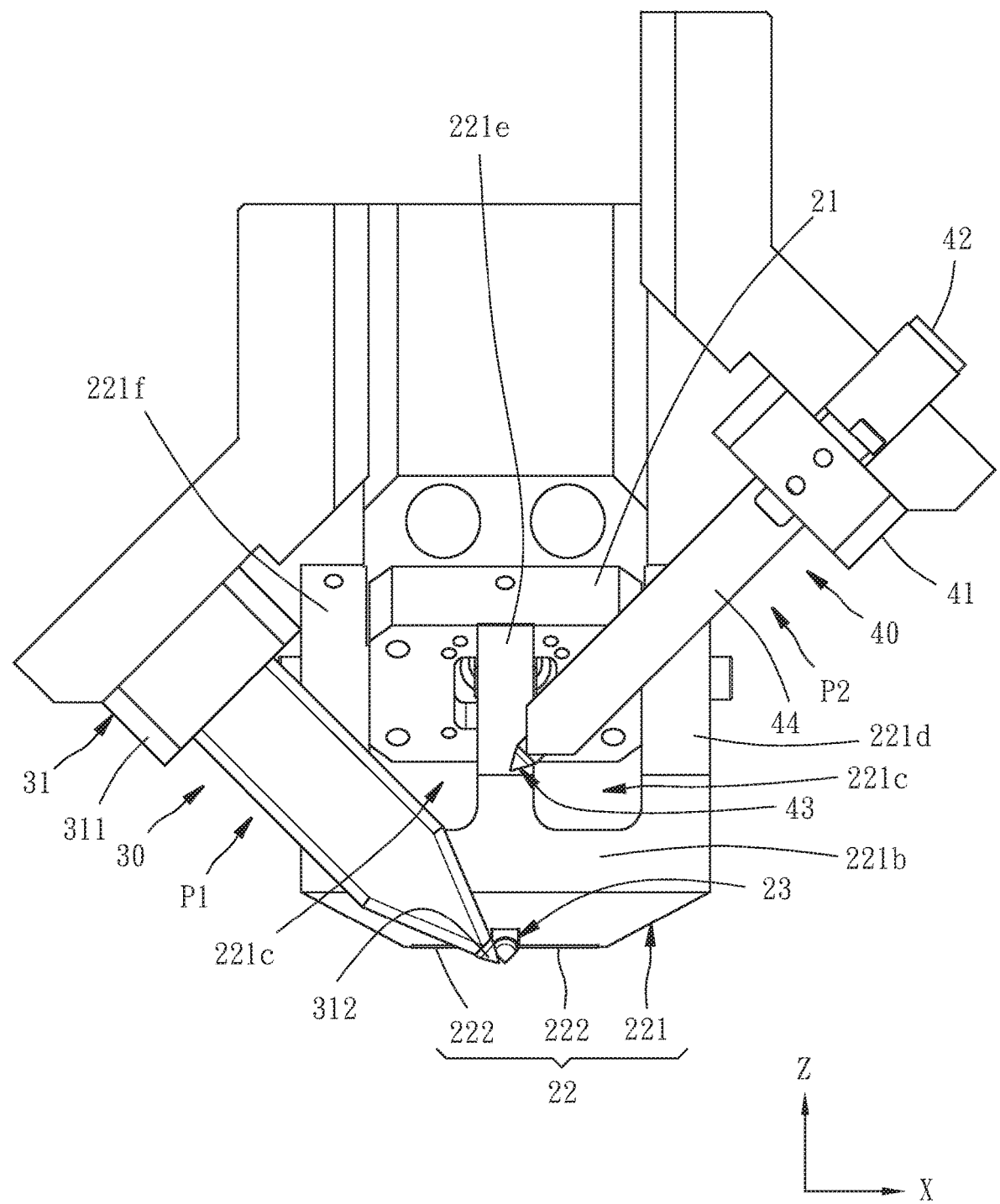
FIGS. 13 and 14 are lateral view and partial front view of FIG. 12 respectively.
Figure 14:
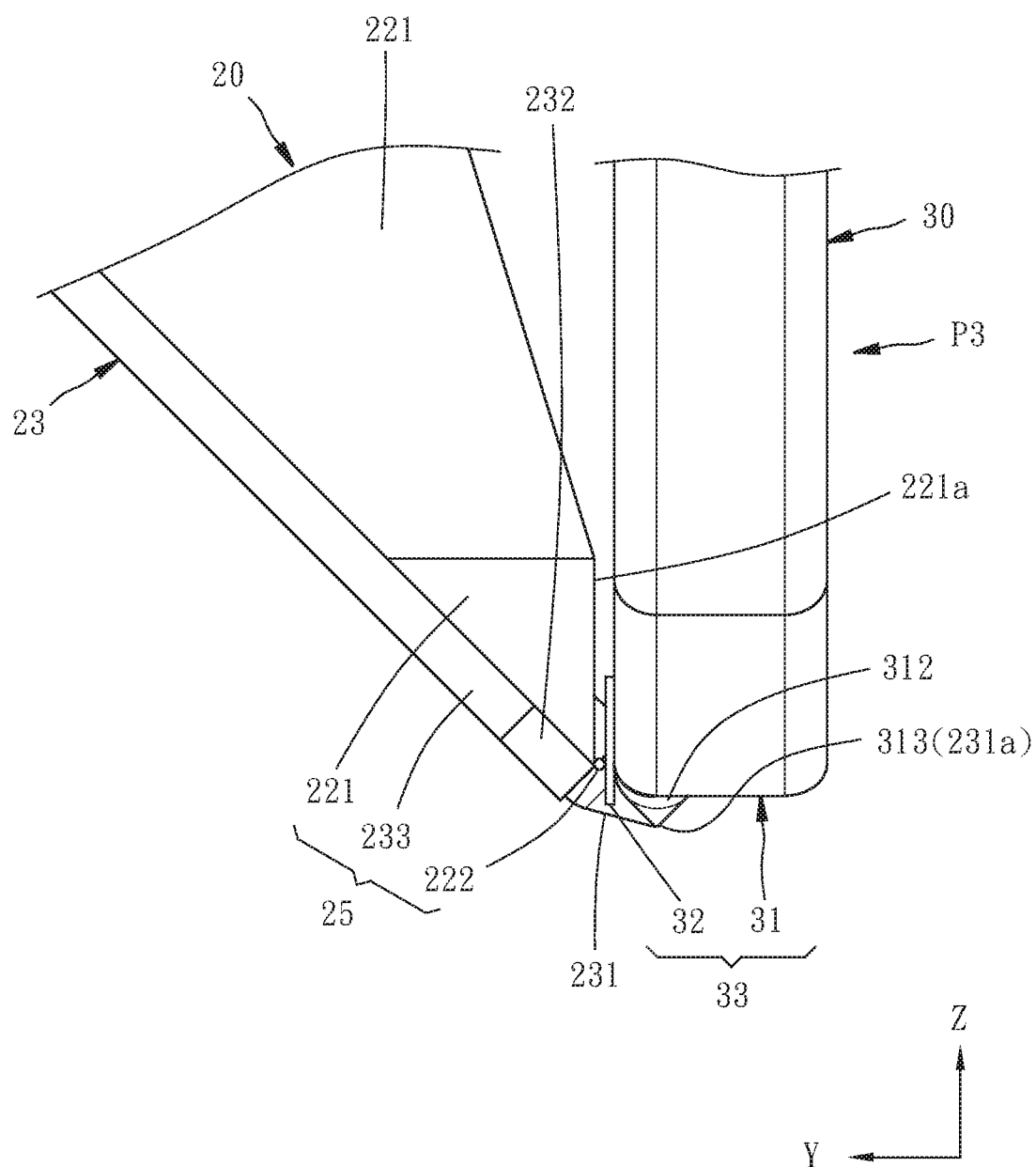

The fixed probe 20 includes a fixed member 21 detachably fixed to the probe seat 96 by screws, an electrically conductive frame 22 fixed to the fixed member 21, a needle 23 fixed to the electrically conductive frame 22, and a coaxial connector 24 fixed to the fixed member 21. Specifically speaking, the needle 23 includes a core 231 made of metal, an insulating layer 232 surrounding the core 231, and an electrically conductive layer 233 surrounding the insulating layer 23. The electrically conductive frame 22 includes a frame body 221 made of metal, and two replaceable conductors 222 made of metal and shaped as pillars, such as but unlimited to circular columns, as shown in FIGS. 12 and 13. The frame body 221 is approximately shaped as a plate inclined relative to the Y-axis and the Z-axis. The electrically conductive layer 233 of the needle 23 is fixed to the frame body 221 by welding in a way that the needle 23 is inclined in the same manner with the frame body 221. The two replaceable conductors 222 are fixed by welding to an edge of a surface 221a of the frame body 221 parallel to the X-Z plane as shown in FIG. 14 and located on two sides of the needle 23 respectively. The longitudinal direction of each replaceable conductor 222, i.e. the axial direction of the circular-column-shaped replaceable conductor, is parallel to the X-axis. In this way, the frame body 221, the two replaceable conductors 222 and the electrically conductive layer 233 of the needle 23 are electrically conductive to each other and collectively compose a ground unit 25 of the fixed probe 20 as shown in FIG. 14. The ground unit 25 is insulated from the core 231. A contact end 231a of the core 231 is adapted to contact an electrically conductive contact of a device under test (not shown), i.e. a circuit board. When the coaxial connector 24 is connected with the coaxial signal cable 11 as shown in FIG. 1 and thereby electrically connected to a testing machine (not shown), the ground unit 25 is electrically connected to ground potential and the core 231 is adapted for transmitting test signal between the testing machine and the electrically conductive contact of the device under test. Besides, the slide rails 92, sliders 93 and elastic members 99 of the fixed probe seat unit 90 enable the fixed probe 20 to displace along the Z-axis, thereby absorbing the overdrive of the probing stroke and providing the fixed probe 20 stable probing force by the pushing of the elastic members 99, so that the contact end 231a of the fixed probe 20 can be electrically conductive to the electrically conductive contact of the device under test stably and positively. In other words, the position of the fixed probe 20 on the X-axis and the Y-axis is fixed, but the fixed probe 20 is elastically movable along the Z-axis for responding accordingly to the probing stroke.

Figure 20:
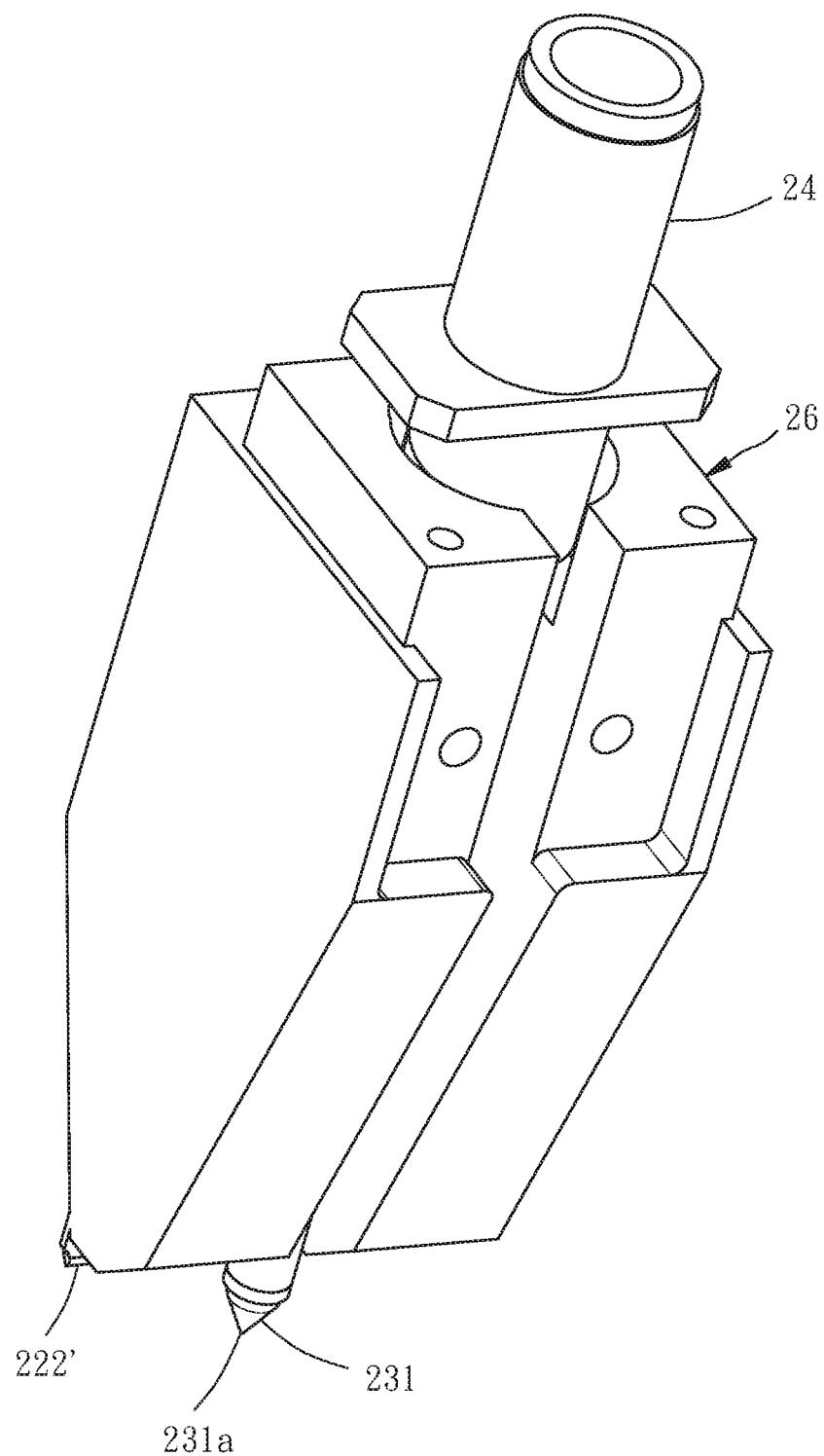
FIG. 20 is an assembled perspective view of another type of fixed probe.
Figure 21:
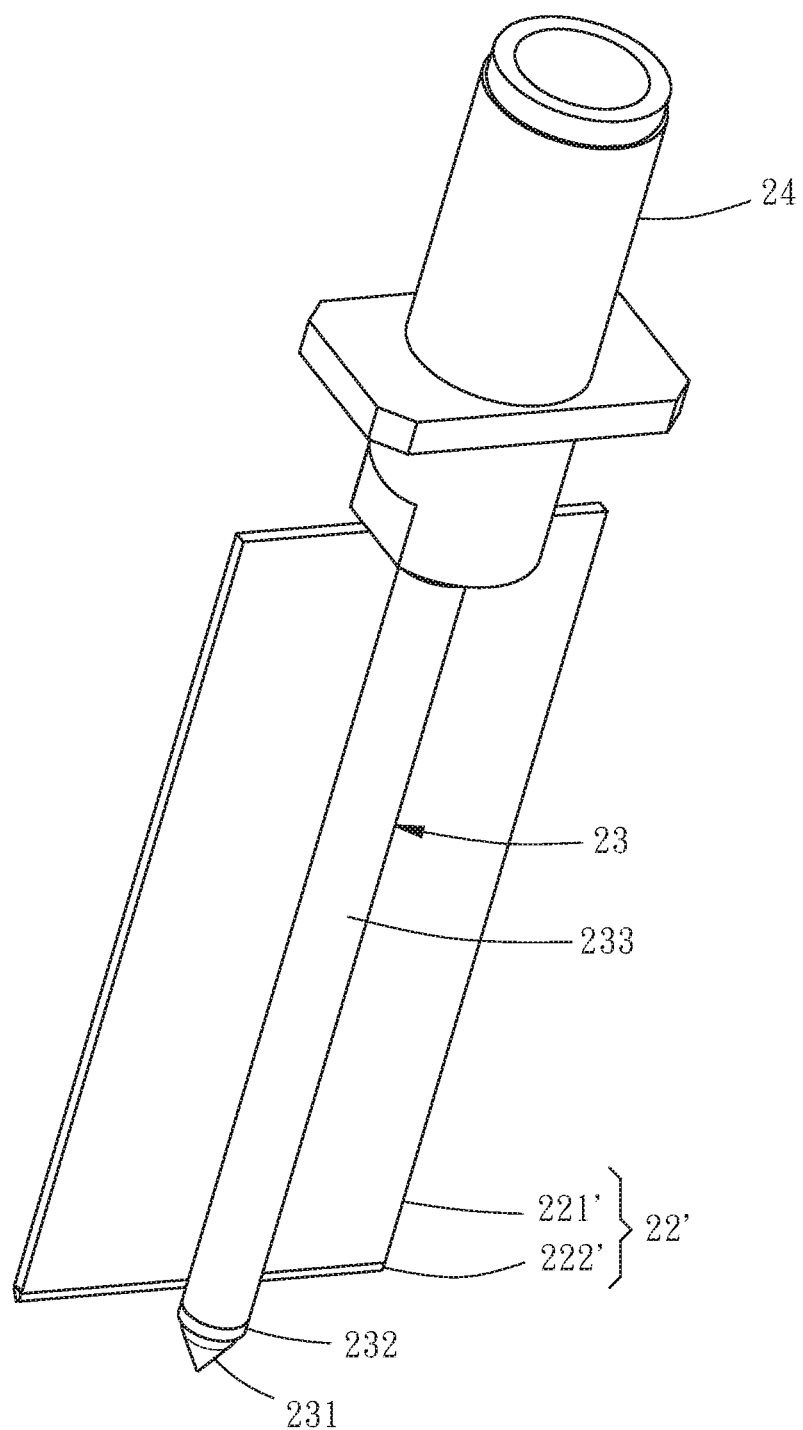
FIG. 21 is similar to FIG. 20, but not showing a case of the fixed probe.

As shown in FIGS. 10 and 13, the frame body 221 of the electrically conductive frame 22 is a quite thick plate having a hollow configuration. Specifically speaking, the frame body 221 is fork-shaped and includes a base portion 221b, two grooves 221c and three branches 221d-f connected with the base portion 221b and divided by the two grooves 221c. The electrically conductive layer 233 of the needle 23 is fixed to the branch 221e of the frame body 221. Such frame body 221 has high structural strength and can be fixed to the probe seat 96 through the fixed member 21 in a thread fixing manner. Besides, the two grooves 221c cause the frame body 221 relatively lower weight and relatively better electrical properties resulted from relatively smaller volume. However, the electrically conductive frame of the fixed probe in the present invention may be configured as the electrically conductive frame 22' shown in FIG. 21, which includes a frame body 221' shaped as a complete plate and a replaceable conductor 222' fixed on a bottom edge of the frame body 221'. The electrically conductive layer 233 of the needle 23 is fixed to a surface of the frame body 221'. Compared with the above-described frame body 221, the frame body 221' is a plate thinner in thickness and having lower weight and smaller volume, thereby having even better electrical properties. As shown in FIG. 20, the frame body 221' and the needle 23 may be disposed in a case 26, as long as the replaceable conductor 222' and the contact end 231a of the core 231 of the needle 23 are exposed outside the case 26. In this way, the case 26 can be fixed to the probe seat 96 through an element similar to the fixed member 21 shown in FIG. 10.

Referring to FIGS. 12-14, the first movable probe 30 includes a needle 31 and a replaceable conductor 32. The needle 31 is integrally made of metal and provided on two ends thereof with a fixed portion 311 and a pinpoint portion 312 respectively. The fixed portion 311 is detachably fixed by screws to the installation portion 832 of the probe seat 83 of the third movable unit 80 disposed on the installation portion 642 of the first movable unit 60. The pinpoint portion 312 has a contact end 313 for contacting an electrically conductive contact of the device under test. The replaceable conductor 32 is made of metal and shaped as a pillar, such as but unlimited to a circular column. The replaceable conductor 32 is fixed to the needle 31 by welding in a way that the longitudinal direction of the replaceable conductor 32, i.e. the axial direction of the circular-column-shaped replaceable conductor, is non-parallel to the X-axis and the replaceable conductor 32 is located adjacent to the pinpoint portion 312. In this way, the needle 31 and the replaceable conductor 32 are electrically conductive to each other and collectively compose a ground unit 33 of the first movable probe 30 as shown in FIG. 14.

Figure 18:
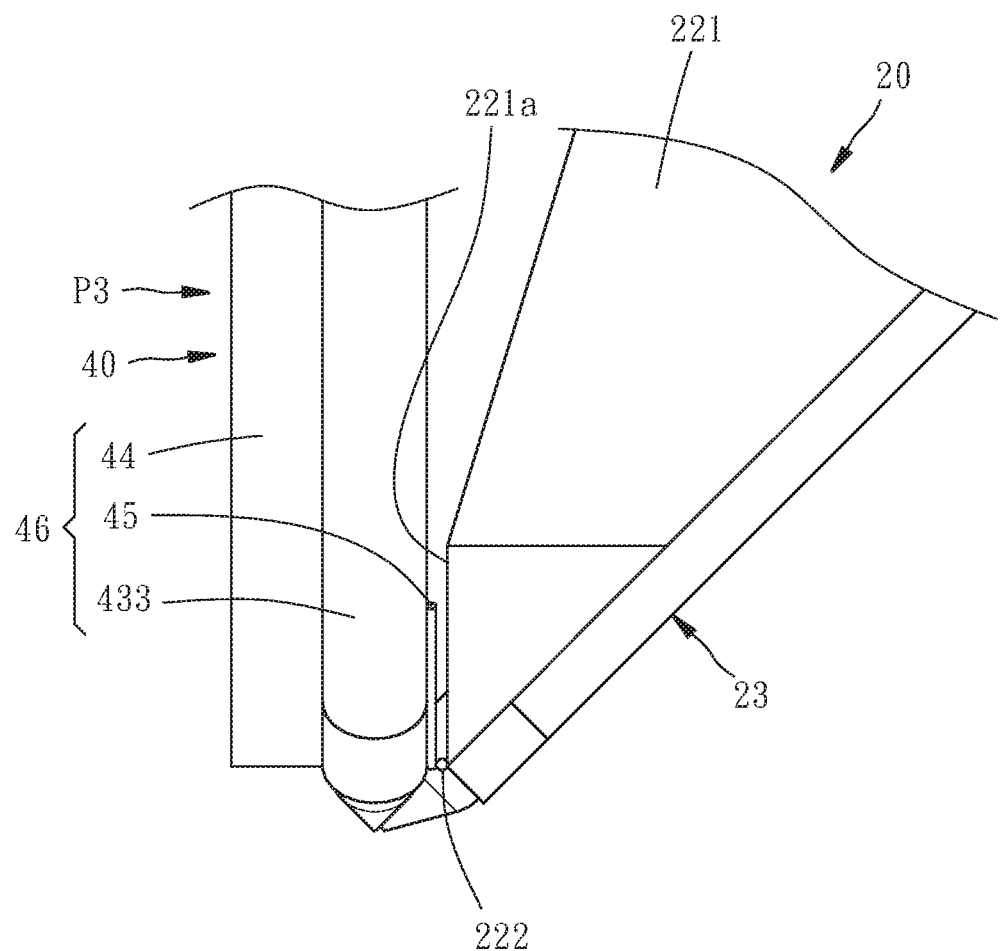
Figure 19:
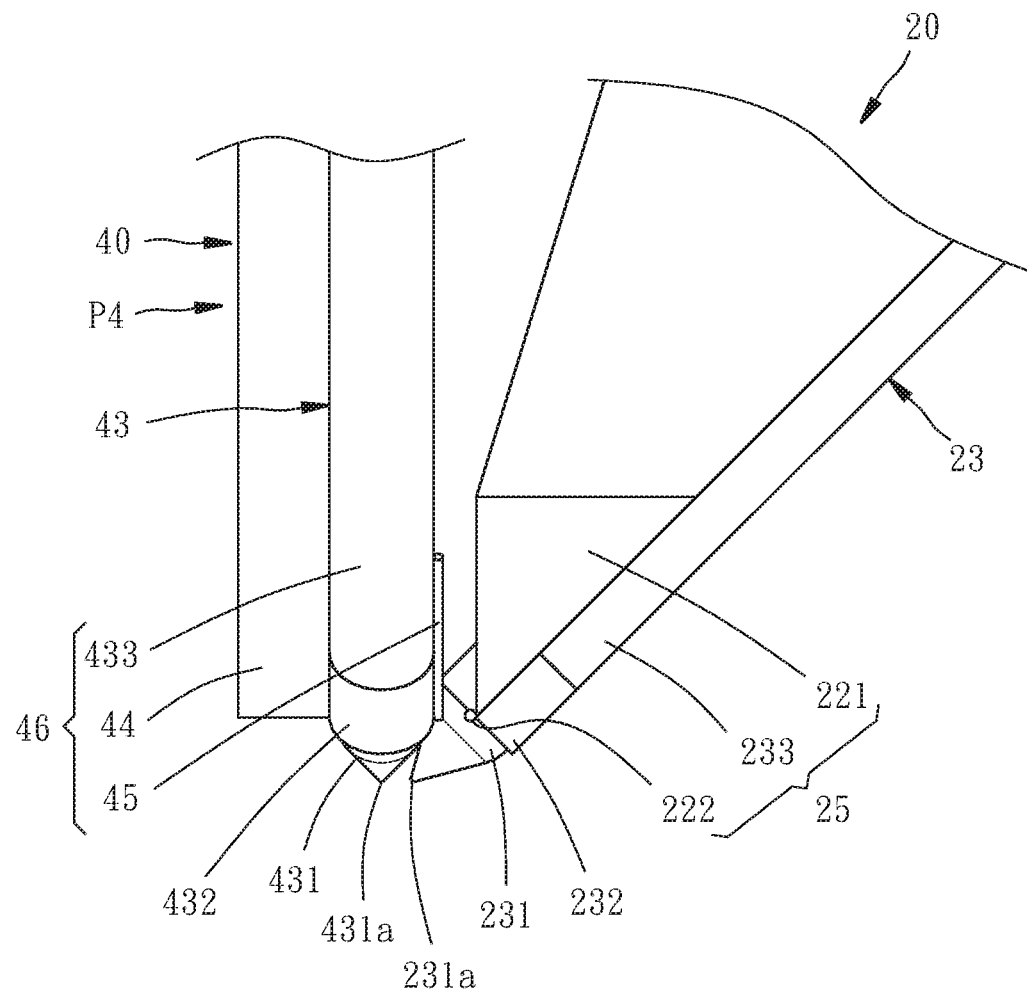
FIG. 19 is similar to FIG. 18, but a second movable probe of the adjustable probe device is located at abutted and non-abutted positions in FIGS. 18 and 19 respectively.

Referring to FIGS. 16-19, the second movable probe 40 includes a fixed member 41 detachably fixed by screws to the installation portion 832 of the probe seat 83 of the third movable unit 80 disposed on the installation portion 632 of the first movable unit 60, a coaxial connector 42 fixed to the fixed member 41, a needle 43 connected to the coaxial connector 42, and a supporting plate 44 and a replaceable conductor 45 both fixed to the needle 43. The needle 43 is identical to the needle 23 of the fixed probe 20. The needle 43 includes a core 431 made of metal, an insulating layer 432 surrounding the core 431, and an electrically conductive layer 433 surrounding the insulating layer 432. The supporting plate 44 is made of metal and fixed to the electrically conductive layer 433 of the needle 43 by welding. The replaceable conductor 45 is made of metal and shaped as a pillar, such as but unlimited to a circular column. The replaceable conductor 45 is fixed to the electrically conductive layer 433 of the needle 43 by welding in a way that the longitudinal direction of the replaceable conductor 45, i.e. the axial direction of the circular-column-shaped replaceable conductor, is non-parallel to the X-axis. In this way, the supporting plate 44, the replaceable conductor 45 and the electrically conductive layer 433 of the needle 43 are electrically conductive to each other and collectively compose a ground unit 46 of the second movable probe 40 as shown in FIG. 19. The ground unit 46 is insulated from the core 431. A contact end 431a of the core 431 is adapted for contacting an electrically conductive contact of the device under test (not shown).

By the two third drive units 18 driving the two movable probes 30 and 40 through the third movable units 80, the two movable probes 30 and 40 are individually movable along the Z-axis between a functioning position P1 and a non-functioning position P2. When anyone of the movable probes 30 and 40 is located at the functioning position P1, the contact end 313 or 431a thereof and the contact end 231a of the fixed probe 20 are located on a same imaginary plane parallel to the first axis (X-axis) and the second axis (Y-axis), i.e. located on a same X-Y plane, thereby capable of contacting two electrically conductive contacts of the device under test at the same time. Therefore, the adjustable probe device 10 is adapted for the user to choose anyone of the two movable probes 30 and 40 to serve as a functioning probe used in association with the fixed probe 20. That means the chosen one of the two movable probes 30 and 40 to be the functioning probe is located at the functioning position P1 thereof, and the other one moves to the non-functioning position P2 thereof to avoid obstructing the proceeding of the testing.

FIGS. 12-15 show the condition that the first movable probe 30 is located at the functioning position P1 thereof and the second movable probe 40 is located at the non-functioning position P2 thereof. That means the first movable probe 30, which serves as the functioning probe, and the fixed probe 20 are adapted for contacting two electrically conductive contacts of the device under test at the same time. The first movable probe 30 is a ground probe, the ground unit 33 of which is physically abutted against the ground unit 25 of the fixed probe 20. In this embodiment, the replaceable conductor 32 of the first movable probe 30 is abutted against the replaceable conductor 222 of the fixed probe 20. At this time, the first drive unit 14 can drive the two movable probes 30 and 40 to move simultaneously along the X-axis to make the first movable probe 30 serving as the functioning probe slide linearly along the X-axis. In such manner, the interval between the contact end 313 of the first movable probe 30 and the contact end 231a of the fixed probe 20 is adjustable according to the interval between the electrically conductive contacts of the device under test. The fixed probe 20 and the first movable probe 30 may have no such replaceable conductors 222 and 32, and the needle 31 is directly abutted against the frame body 221 of the electrically conductive frame 22. However, the replaceable conductors 222 and 32 have the advantage of preventing the needle 31 and the frame body 221 from abrasion. When the replaceable conductor 222 or 32 has excessive abrasion, the replaceable conductor 222 or 32 can be detached by dewelding and replaced by a new replaceable conductor 222 and 32 by welding.

Figure 15:
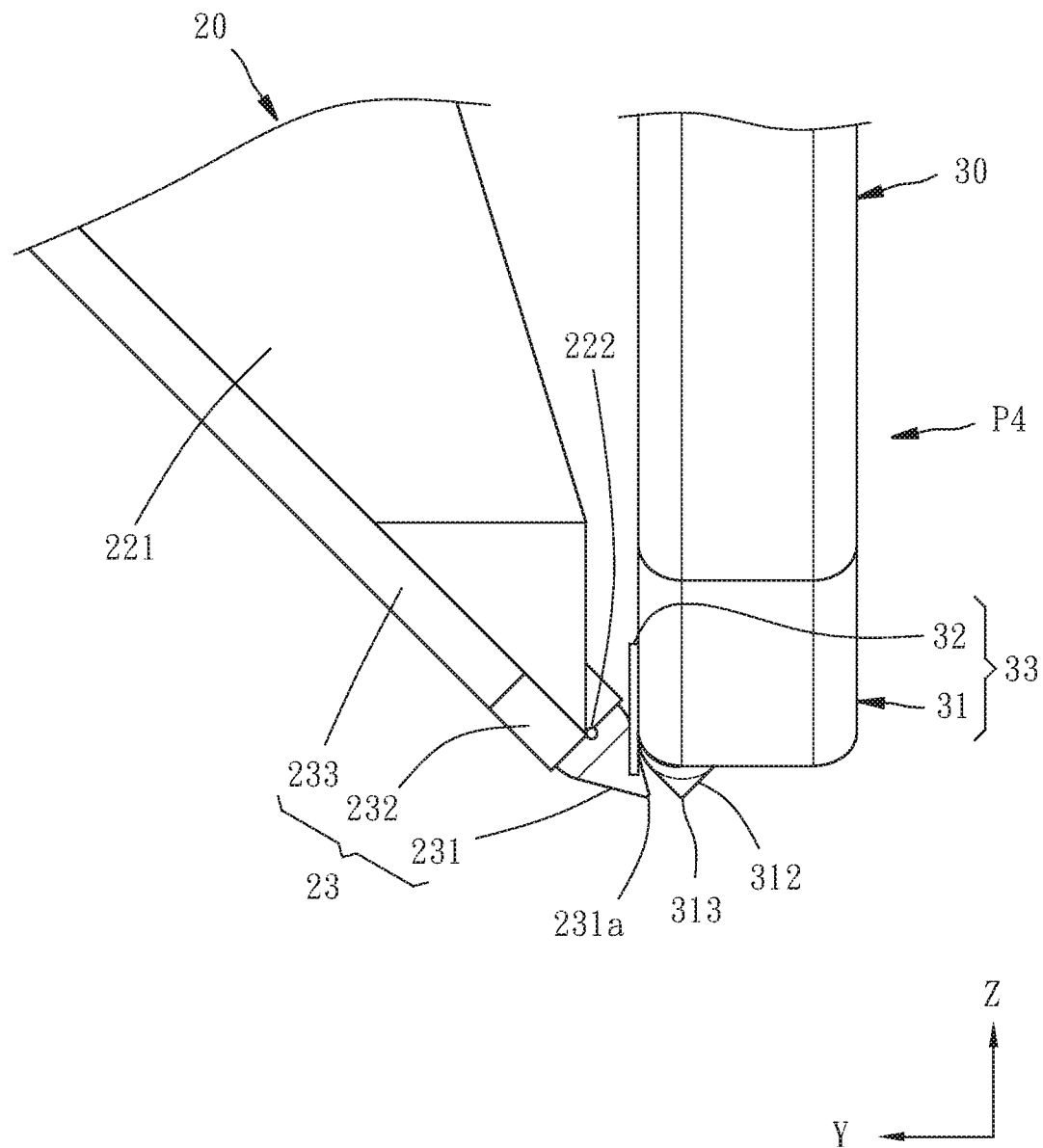
FIG. 15 is similar to FIG. 14, but a first movable probe of the adjustable probe device is located at abutted and non-abutted positions in FIGS. 14 and 15 respectively.
Figure 16:
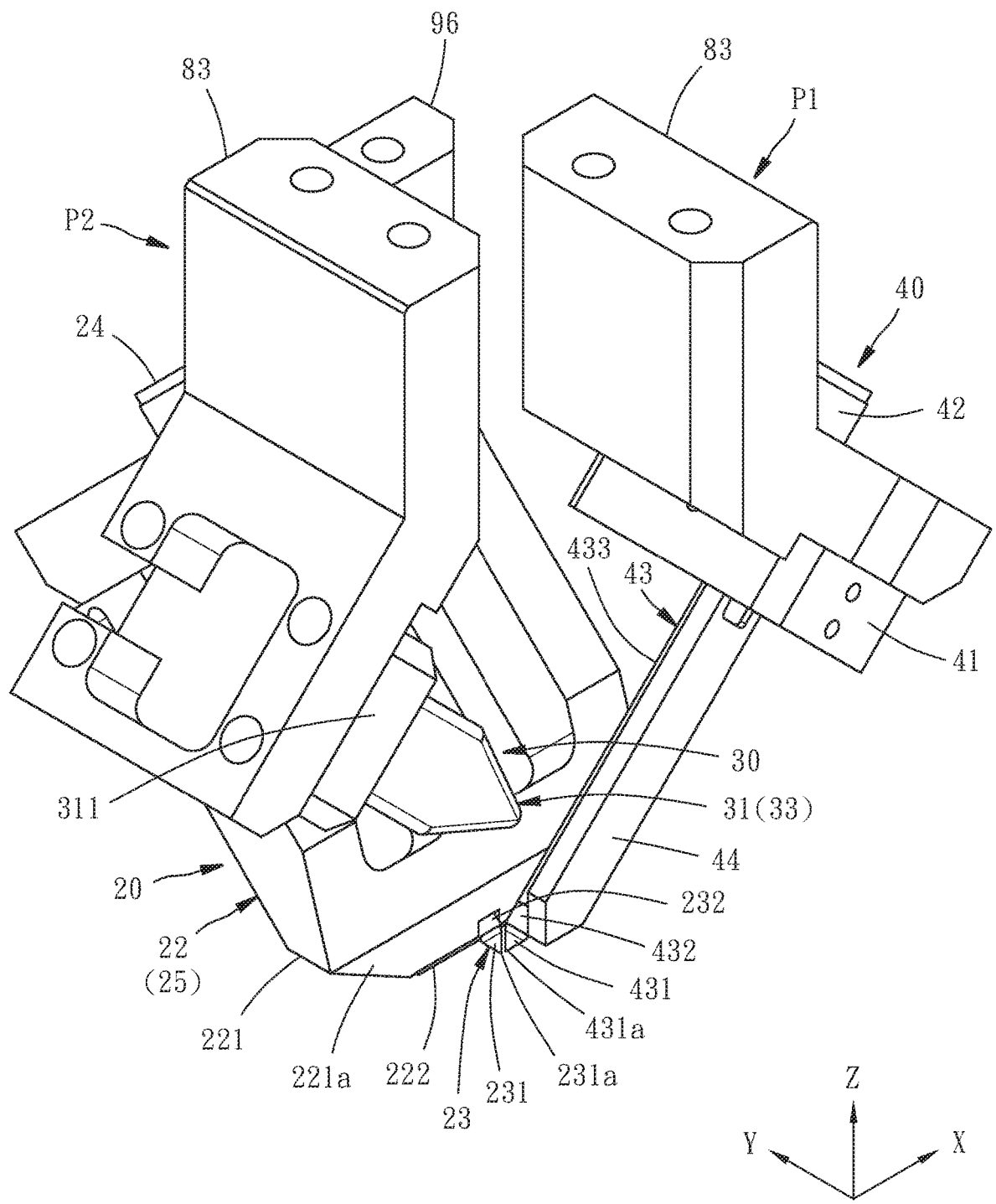
FIG. 16 is similar to FIG. 12, but showing another usage condition of the adjustable probe device.
Figure 17:
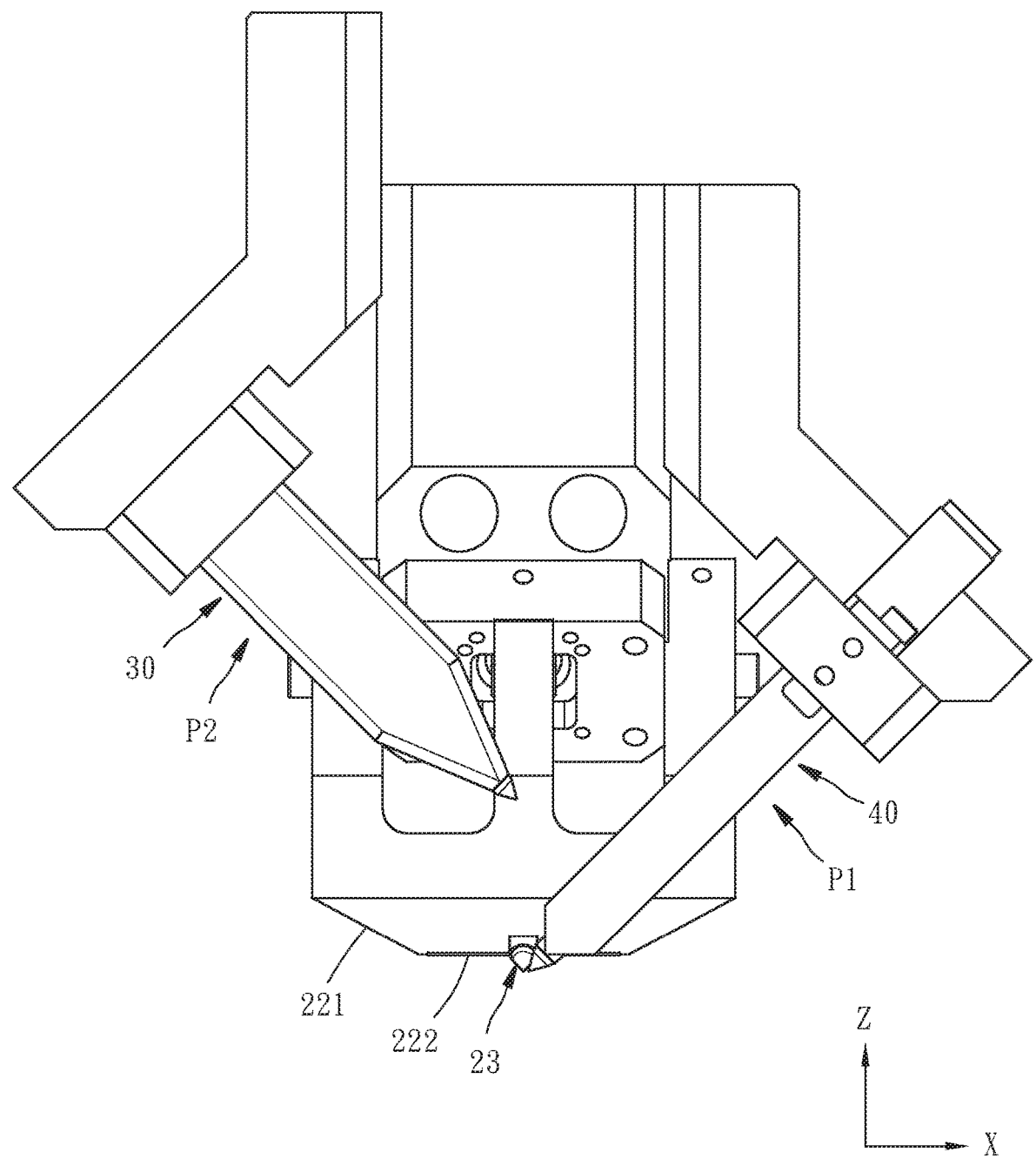
FIGS. 17 and 18 are lateral view and partial rear view of FIG. 16 respectively.

During the above-described probe interval adjustment, the first movable probe 30 may be firstly driven by the second drive unit 16 to move along the Y-axis from an abutted position P3 as shown in FIG. 14 to a non-abutted position P4 as shown in FIG. 15. When the first movable probe 30 is located at the non-abutted position P4 thereof, the contact end 313 thereof and the contact end 231a of the fixed probe 20 are located on different X-Z planes. At this time, the replaceable conductor 32 of the first movable probe 30 and the replaceable conductor 222 of the fixed probe 20 are no longer abutted against each other. After that, the two movable probes 30 and 40 are moved along the X-axis to adjust the X-axial relative position between the first movable probe 30 and the fixed probe 20 to almost the demanded X-axial position, and then the first movable probe 30 is moved along the Y-axis back to the abutted position P3 thereof to make the contact end 313 thereof and the contact end 231a of the fixed probe 20 located on the same X-Z plane, as shown in FIG. 14. At this time, the replaceable conductor 32 of the first movable probe 30 is abutted against the replaceable conductor 222 of the fixed probe 20. After that, the two movable probes 30 and 40 can be further moved along the X-axis to fine-adjust the X-axial position of the first movable probe 30 to the demanded position. Such adjusting manner can reduce the abrasion of the replaceable conductors 222 and 32 resulted from the sliding contact therebetween.

FIGS. 16-19 show the condition that the second movable probe 40 is located at the functioning position P1 thereof and the first movable probe 30 is located at the non-functioning position P2 thereof. That means the second movable probe 40, which serves as the functioning probe, and the fixed probe 20 are adapted to contact two electrically conductive contacts of the device under test at the same time. At this time, the coaxial connector 42 of the second movable probe 40 is connected with the coaxial signal cable 13 as shown in FIG. 1 and thereby electrically connected to the testing machine. In other words, the second movable probe 40 and the fixed probe 20 are both signal probes. The ground unit 46 is electrically connected to ground potential. The core 431 is adapted for transmitting test signal between the testing machine and the electrically conductive contact of the device under test. Besides, as the above-described first movable probe 30, the second movable probe 40 is linearly slidable along the X-axis in a way that the replaceable conductor 45 thereof is abutted against the replaceable conductor 222 of the fixed probe 20. Therefore, the interval between the contact end 431a of the second movable probe 40 and the contact end 231a of the fixed probe 20 is adjustable according to the interval between the electrically conductive contacts of the device under test. As the above-described first movable probe 30, the second movable probe 40 may be moved along the Y-axis from the abutted position P3 as shown in FIG. 18 to the non-abutted position P4 as shown in FIG. 19 firstly, and moved along the Y-axis back to the abutted position P3 after being moved to almost the demanded X-axial position, for reducing the abrasion of the replaceable conductors 222 and 45. The second movable probe 40 may have no such replaceable conductor 45, and the electrically conductive layer 433 of the needle 43 is directly abutted against the frame body 221 of the electrically conductive frame 22. However, the replaceable conductor 45 has the advantage of preventing the electrically conductive layer 433 of the needle 43 from abrasion. When the replaceable conductor 45 has excessive abrasion, the replaceable conductor 45 can be detached by dewelding and replaced by a new replaceable conductor 45 by welding.

Referring to FIGS. 4 and 7, the first movable unit 60 further includes two abutment members 66 fixed to the installation portions 632 and 642 of the two connecting seats 63 and 64 respectively, two shafts 67 penetrating through the two abutment members 66 respectively and fixed to the installation plates 71 of the two second movable units 70 respectively, and two elastic members 68 sleeved onto the two shafts 67 respectively and abutted between the two abutment members 66 and the two installation plates 71 respectively. The two movable probes 30 and 40 are pushed toward the abutted position P3 by the two elastic members 68 respectively through the second movable units 70. In this way, when anyone of the movable probes 30 and 40 serves as the functioning probe, the pushing force from the associated elastic member 68 can make the ground unit of the functioning probe abutted against the ground unit of the fixed probe relatively more positively.

Referring to FIGS. 4 and 8, each of the second movable units 70 further includes an abutment member 73 fixed to the installation plate 71, two shafts 74 penetrating through the abutment member 73 and fixed to the associated probe seat 83, and two elastic members 75 abutted between the associated abutment member 73 and probe seat 83. The two movable probes 30 and 40 are pushed toward the functioning position P1 by the elastic members 75 of the two second movable units 70 respectively through the third movable units 80. In this way, when anyone of the movable probes 30 and 40 serves as the functioning probe, the associated elastic members 75 can absorb the overdrive and push the functioning probe to provide the functioning probe stable probing force, thereby making the contact end of the functioning probe electrically conductive to the electrically conductive contact of the device under test stably and positively.

It can be known from the above description that the fixed probe 20 and the second movable probe 40 are both signal probes, and the first movable probe 30 is a ground probe. The user can choose anyone of the first and second movable probes 30 and 40 to be used in association with the fixed probe 20 according to the testing requirement. That means the user can select a collocation of a signal probe with another signal probe or another collocation of a signal probe with a ground probe. The ground unit of the chosen movable probe, i.e. the functioning probe, and the ground unit of the fixed probe are electrically conductive to each other by being abutted against each other. The distance between the functioning probe and the fixed probe is changeable by the linear sliding of the functioning probe along the first axis (X-axis). Therefore, the interval between the pinpoints of the fixed probe and the functioning probe is adjustable according to the interval between the electrically conductive contacts of the device under test. As a result, the user can save the cost of the testing apparatus for the replacement of the probe device for different probe intervals. Although a conductive wire can be used to connect two probes to make the interval between the two probes adjustable and keep the ground potential of the two probes electrically conductive to each other through the conductive wire, in such manner the types of the two probes are fixed without selectiveness among ground probe and signal probe and the conductive wire should be quite long in length to make the interval between the two probes adjustable in a quite long range. In such condition, the conductive wire will bring usage inconvenience. Besides, no matter the two probes have large or small interval therebetween, the ground potential of the two probes are electrically conductive to each other through the quite long conductive wire, which means the length of the ground of the two probes is provided according to the largest interval of the two probes. However, the length of a single electrically conductive contact of the device under test and the length of the conductive wire should be provided according to a specific proportion. If the conductive wire is quite long in length, a single electrically conductive contact of the device under test should be longer than a quite long length to enable the two probes connected by the conductive wire to be used in the testing, no matter the two probes have large or small interval therebetween. On the contrary, in the present invention the functioning probe is selective from the ground probe and the signal probe, and the functioning probe and the fixed probe are relatively slidably abutted against each other to make the ground potential thereof electrically conductive to each other. No matter the functioning probe and the fixed probe have large or small interval therebetween, the ground units thereof are abutted against each other directly, which is an equivalent of that the length of the conductive wire connecting the functioning probe and the fixed probe equals to the interval between the functioning probe and the fixed probe. When the interval between the functioning probe and the fixed probe is not the largest interval but relatively smaller, the length of a single electrically conductive contact of the device under test is modifiable according to the interval between the functioning probe and the fixed probe, unlimited to be larger than a quite long length. That reduces the spatial complexity of the circuit arrangement of the device under test and the manufacturing cost. Besides, the drive mechanism 12 in this embodiment drives the two movable probes 30 and 40 to move along the X-axis simultaneously for the adjustment of the distance between the functioning probe and the fixed probe. Such manner can save the cost of drivers, simplify the structure of the drive mechanism 12 and benefit the spatial arrangement thereof. It is to be mentioned that the top plate 52 of the fixed unit 50 of the drive mechanism 12 may be connected to a rotary driver (not shown) in a way that the rotary driver can change the direction of the drive mechanism 12 and the probes 20, 30 and 40 for responding accordingly to the demanded testing angle for the device under test.

It should be noticed that the whole adjustable probe device 10 of the present invention is actually displaceable by the driving of a mechanism (not shown) for probing a plurality of sets of electrically conductive contacts (pads) of the PCB. That means when the PCB is under test, the fixed and movable probes 20, 30 and 40 and the drive mechanism 12 are driven together by the aforementioned mechanism to the position corresponding to the electrically conductive contacts to be tested, and then the above-described adjustment of the probe interval is performed according to the interval between the electrically conductive contacts to be tested. Therefore, when it is mentioned in the present invention that the position of the fixed probe 20 on the X-axis and the Y-axis is fixed, it means when the adjustable probe device 10 is moved by the aforementioned mechanism to the probing position to-be and the mechanism temporarily stops moving the whole adjustable probe device 10, the position of the fixed probe 20 on the X-axis and the Y-axis is fixed at this time. In other words, the fixed probe 20 mentioned in the present invention refers to the probe whose position on the X-axis and the Y-axis is relatively fixed to the fixed unit 50 of the drive mechanism 12.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An adjustable probe device for impedance testing for a circuit board, the adjustable probe device comprising:
   a fixed probe and a movable probe, each of the fixed probe and the movable probe comprising a ground unit for being electrically connected to ground potential, at least one of the fixed probe and the movable probe further comprising a core relatively fixed to and insulated from the ground unit for transmitting test signal, the movable probe being linearly slidable relative to the fixed probe along a first axis in a way that the ground unit of the movable probe is abutted against the ground unit of the fixed probe;
   wherein the fixed probe comprises a replaceable conductor, and a needle comprising the core, an insulating layer surrounding the core, and an electrically conductive layer surrounding the insulating layer; the electrically conductive layer of the needle is electrically conductive with the replaceable conductor of the fixed probe;
   wherein the movable probe comprises a needle and a replaceable conductor fixed and electrically conductive to the needle of the moveable probe; the movable probe is linearly slidable relative to the fixed probe along the first axis in a way that the replaceable conductor of the movable probe is abutted against the replaceable conductor of the fixed probe; the replaceable conductor of the fixed probe is shaped as a pillar whose longitudinal direction is parallel to the first axis; the replaceable conductor of the movable probe is shaped as a pillar whose longitudinal direction is non-parallel to the first axis.

2. The adjustable probe device as claimed in claim 1, wherein the movable probe is movable relative to the fixed probe along a second axis perpendicular to the first axis.

3. The adjustable probe device as claimed in claim 1, wherein the fixed probe comprises an electrically conductive frame; the electrically conductive frame comprises a frame body; the electrically conductive layer of the needle is fixed and electrically conductive to the frame body.

4. The adjustable probe device as claimed in claim 3, wherein the replaceable conductor of the fixed probe is fixed and electrically conductive to the frame body.

5. The adjustable probe device as claimed in claim 1, comprising two said replaceable conductors of the fixed probe located on two sides of the needle of the fixed probe respectively.

6. An adjustable probe device for impedance testing for a circuit board, the adjustable probe device comprising:
a fixed probe comprising a ground unit for being electrically connected to ground potential, and a core for transmitting test signal, the core of the fixed probe having a contact end, the ground unit and the core of the fixed probe being relatively fixed to each other and insulated from each other; and
two movable probes each comprising a ground unit for being electrically connected to the ground potential, the two movable probes comprising a first movable probe and a second movable probe, the ground unit of the first movable probe having a contact end, the second movable probe comprising a core for transmitting test signal, the core of the second movable probe having a contact end, the ground unit and the core of the second movable probe being relatively fixed to each other and insulated from each other;
wherein one of the two movable probes is selectable to serve as a functioning probe of the adjustable probe device in a way that the contact end of the functioning probe and the contact end of the fixed probe are located on a same imaginary plane parallel to a first axis and a second axis perpendicular to the first axis, and the functioning probe is linearly slidable relative to the fixed probe along the first axis in a way that the ground unit of the functioning probe is abutted against the ground unit of the fixed probe.

7. The adjustable probe device as claimed in claim 6, wherein each of the movable probes comprises a needle and a replaceable conductor fixed and electrically conductive to the needle; the functioning probe is linearly slidable relative to the fixed probe along the first axis in a way that the replaceable conductor of the functioning probe is abutted against the ground unit of the fixed probe.

8. The adjustable probe device as claimed in claim 6, wherein the two movable probes are movable relative to the fixed probe along the second axis between an abutted position and a non-abutted position; when each of said movable probes is located at the abutted position, the contact end of the each of said moveable probes and the contact end of the fixed probe are located on a same imaginary plane perpendicular to the second axis.

9. The adjustable probe device as claimed in claim 6, wherein the two movable probes are movable individually relative to the fixed probe along a third axis perpendicular to the first axis and the second axis between a functioning position and a non-functioning position; when each of said movable probes is located at the functioning position, the contact end of the each of said moveable probes and the contact end of the fixed probe are located on a same imaginary plane parallel to the first axis and the second axis.

10. The adjustable probe device as claimed in claim 6, wherein a relative position on the first axis between the two movable probes is fixed.

11. The adjustable probe device as claimed in claim 10, wherein the adjustable probe device comprises a drive mechanism; the drive mechanism comprises a fixed unit, a first drive unit disposed on the fixed unit, and a first movable unit disposed on the fixed unit and capable of being driven by the first drive unit to move along the first axis; the fixed unit comprises a base; the base has a top surface, a bottom surface, and two through holes penetrating through the top surface and the bottom surface; the first drive unit is disposed on the top surface of the base; the first movable unit is partially disposed on the top surface of the base and comprises two installation portions; the two installation portions are respectively inserted through the two through holes in a way that the two installation portions are simultaneously movably along the first axis and partially located on the bottom surface of the base; the two movable probes are disposed on the two installation portions, respectively.

12. The adjustable probe device as claimed in claim 11, wherein the first drive unit comprises a first driver; the first driver comprises a main body fixed to the fixed unit of the drive mechanism, and an output shaft movable along the first axis relative to the main body; the main body has a slideway; the first movable unit is fixed to the output shaft and disposed on the slideway slidably along the first axis.

13. The adjustable probe device as claimed in claim 11, wherein the drive mechanism further comprises two second movable units respectively disposed on the two installation portions movably along the second axis; the two movable probes are disposed on the two second movable units respectively to be movable along the second axis between an abutted position and a non-abutted position; when each of said movable probes is located at the abutted position, the contact end of the each of said moveable probes and the contact end of the fixed probe are located on a same imaginary plane perpendicular to the second axis.

14. The adjustable probe device as claimed in claim 13, wherein the first movable unit further comprises two abutment members fixed to the two installation portions respectively, and two elastic members abutted between the two abutment members and the two second movable units respectively; the two movable probes are pushed toward the abutted position by the two elastic members respectively through the second movable units; the drive mechanism further comprises two third drive units disposed on the two second movable units respectively, and two third movable units disposed on the two second movable units respectively; the two movable probes are disposed on the two third movable units respectively; the two third movable units are capable of being driven by the two third drive units respectively to move along a third axis perpendicular to the first axis and the second axis so as to move the associated movable probe along the third axis between a functioning position and a non-functioning position; when each of said movable probes is located at the functioning position, the contact end of the each of said moveable probes and the contact end of the fixed probe are located on a same imaginary plane parallel to the first axis and the second axis; each of the second movable units comprises an abutment member and an elastic member; the elastic members of the two second movable units are abutted between the abutment members of the two second movable units and the two third movable units respectively; the two movable probes are pushed toward the functioning position by the elastic members of the two second movable units respectively through the two third movable units; the drive mechanism further comprises a second drive unit for driving each of said second movable units to move along the second axis; the two second movable units are connected with an installation seat; a driver of the second drive unit drives the installation seat to drive the two second movable units to move along the second axis.

15. The adjustable probe device as claimed in claim 11, wherein the drive mechanism further comprises a fixed probe seat unit; the fixed probe seat unit comprises a fixation seat fixed to the fixed unit, a probe seat disposed on the fixation seat slidably along a third axis perpendicular to the first axis and the second axis, an abutment member relatively fixed to the probe seat, and an elastic member abutted between the abutment member and the fixation seat.

16. The adjustable probe device as claimed in claim 6, wherein the fixed probe comprises an electrically conductive frame and a needle; the electrically conductive frame comprises a frame body; the needle comprises the core, an insulating layer surrounding the core, and an electrically conductive layer surrounding the insulating layer; the electrically conductive layer of the needle is fixed and electrically conductive to the frame body; the ground unit of the fixed probe comprises the electrically conductive frame and the electrically conductive layer of the needle; the functioning probe is linearly slidable relative to the fixed probe along the first axis in a way that the ground unit of the functioning probe is abutted against the electrically conductive frame; the electrically conductive frame further comprises a replaceable conductor fixed and electrically conductive to the frame body; the functioning probe is linearly slidable relative to the fixed probe along the first axis in a way that the ground unit of the functioning probe is abutted against the replaceable conductor of the electrically conductive frame.

17. The adjustable probe device as claimed in claim 16, wherein the replaceable conductor of the electrically conductive frame is shaped as a pillar whose longitudinal direction is parallel to the first axis.

18. The adjustable probe device as claimed in claim 16, wherein each of the movable probes comprises a needle and a replaceable conductor fixed and electrically conductive to the needle; the functioning probe is linearly slidable relative to the fixed probe along the first axis in a way that the replaceable conductor of the functioning probe is abutted against the replaceable conductor of the fixed probe; the replaceable conductor of the electrically conductive frame is shaped as a pillar whose longitudinal direction is parallel to the first axis; the replaceable conductor of the movable probe is shaped as a pillar whose longitudinal direction is non-parallel to the first axis; the electrically conductive frame comprises two said replaceable conductors located on two sides of the needle of the fixed probe respectively.

* * * * *